United States Patent
Ito

(10) Patent No.: US 6,577,550 B2
(45) Date of Patent: Jun. 10, 2003

(54) CONTROL CIRCUIT AND SEMICONDUCTOR MEMORY DEVICE

(75) Inventor: Shigemasa Ito, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/034,308

(22) Filed: Jan. 3, 2002

(65) Prior Publication Data

US 2002/0145929 A1 Oct. 10, 2002

(30) Foreign Application Priority Data

Apr. 6, 2001 (JP) ........................................ 2001-108747

(51) Int. Cl.[7] ................................................. G11C 7/00
(52) U.S. Cl. .................... 365/222; 365/194; 365/189.05
(58) Field of Search ............................ 365/222, 189.05, 365/194, 226, 228, 189.09, 230.03, 233; 711/106, 151

(56) References Cited

U.S. PATENT DOCUMENTS

| | | | | |
|---|---|---|---|---|
| 4,933,907 A | * | 6/1990 | Kumanoya et al. ......... 365/222 |
| 5,469,559 A | * | 11/1995 | Parks et al. ................. 711/106 |
| 5,903,507 A | * | 5/1999 | Arimoto ...................... 365/222 |
| 6,028,804 A | * | 2/2000 | Leung ......................... 365/222 |

* cited by examiner

*Primary Examiner*—David Nelms
*Assistant Examiner*—Gene N. Audoung
(74) *Attorney, Agent, or Firm*—Arent Fox Kintner Plotkin & Kahn, PLLC

(57) ABSTRACT

A control circuit for increasing the speed of a device responding to a control request from an external device when the external control request is overlapped with an internal control request. The control circuit includes a first signal processing unit for receiving the first control signal and generating a first processed signal. The first signal processing unit includes a filter for filtering the first control signal. A second signal processing unit receives the first control signal and generates a second processed signal. An arbiter receives the second processed signal and the second control signal, determines which one of the received signals is to be given priority, and generates a determination signal based on the determination. A main signal generator generates the main signal from the determination signal or the first processed signal based on the determination signal.

17 Claims, 21 Drawing Sheets

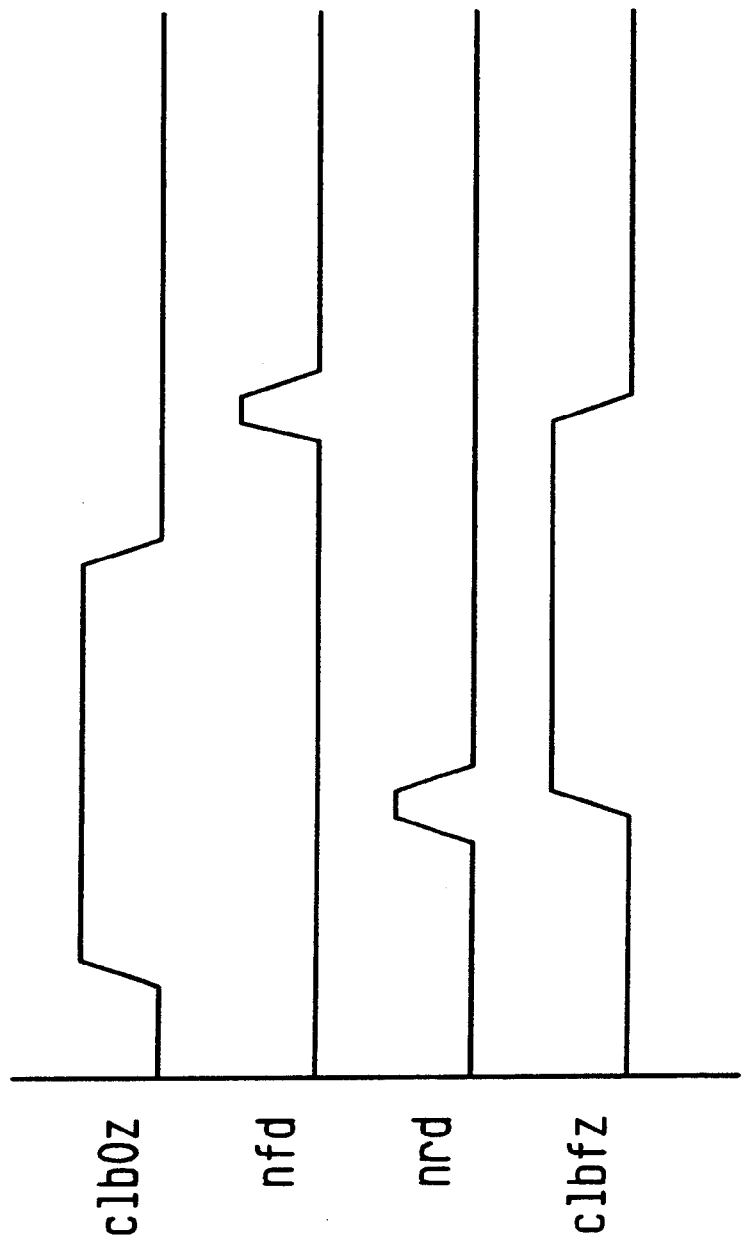

CONTROL CIRCUIT AND SEMICONDUCTOR MEMORY DEVICE

BACKGROUND OF THE INVENTION

The present invention relates to a control circuit that controls an internal circuit based on an external operation request and an internal operation request and to a semiconductor memory device including such control circuit.

Nowadays, a dynamic random access memory (DRAM), which has a large memory capacity, is used in electronic information devices. A DRAM is provided with a self-refresh function that refreshes cell data of a memory cell based on a counter operation of an internal circuit. A DRAM provided with the self-refresh function does not require an external refresh manipulation. Thus, power consumption is reduced and the designing of a circuit about the DRAM is facilitated.

FIG. 1 is a block circuit diagram illustrating a prior art input circuit section of a DRAM 100, which is provided with a self-refresh function.

The DRAM 100 receives an output enable signal /OE, a write enable signal /WE, and a chip enable signal /CE1, which are all control signals. The signals /OE, /WE, /CE1 are provided to filters 14, 15, 16 via input buffers 11, 12, 13, respectively. Each of the input buffers 11–13 is an input initial stage circuit that coverts an input signal to a signal having a level corresponding to an internal voltage of a device and is, for example, a CMOS inverter circuit or a C/M (current mirror) differential amplification circuit.

Each of the filters 14–16 eliminates noise components, such as a glitch, from the signal provided by an external circuit. The data of the DRAM is held using a charge holding technique. When an undetermined noise is included in the input signal, the level of a word line is shifted in a state in which the internal operation of a device has not yet been determined. The elimination of a noise component prevents the data of a memory cell from being damaged.

The noise status of each signal changes in accordance with a system board, in which the DRAM 100 is used. Thus, the filters 14–16 are normally designed to resist noises that may be produced in the worst cases. Accordingly, the set value of the filters 14–16 normally restricts the access time for reading and writing data. Thus, the set value significantly affects the access time.

Output signals oeb5z, web5z, clb5z of the filters 14, 15, 16 are provided to first, second, and third control transition detectors (CTDs) 17, 18, 19 and to a control data decoder (CTLDEC) 20. The transition detectors 17, 18, 19 each detect the transition of the status of the input signal and generates detection signals oerex, werex, cerex.

The control decoder 20 decodes commands based on the voltage level (high level or low level) of the external control signals (in this example, the chip enable signal /CE1, the output enable signal /OE, and the write enable signal /WE). The commands include, for example, a write command and a read command. The control decoder 20 provides a control signal (e.g., a write control signal wrz based on a write command or a read control signal rdz based on a read command), which is based on the decoded command to an activation pulse signal generator (ACTPGEN) 21.

An external address signal Add is provided to an address transition detector (ATD) 24 via an input buffer 22 and a filter 23. The address transition detector 24 detects the transition of an external address signal Add (e.g., the change in the lowermost bit A<0> of the external address signal Add) and generates a detection signal adrex.

The detection signals oerex, werex, cerex, adrex of the respective transition detectors 17, 18, 19 and the detection signal adrex of the address transition detector 24 are provided to an address transition detection signal (ATDS) generator (ATDGEN) 25.

The ATDS generator 25 performs a logical operation on the detection signals oerex, werex, cerex, adrex and generates an activation signal atdpz based on the finally provided control signals /OE, /WE, /CE1 and the external address signal Add. The activation signal atdpz is provided to an external active latch generator (EALGEN) 26 and a refresh controller (REFCTL) 27.

The external active latch generator 26 generates a main signal mpealz, which activates a device based on the activation signal atdpz, and provides the main signal mpealz to the activation pulse signal generator 21.

The activation pulse signal generator 21 generates a write signal wrtz, a read signal redz, and an activation pulse signal actpz based on the control signals wrz, rdz from the control decoder 20 and the main signal mpealz. The activation pulse signal actpz is provided to a row address generator (RASGEN) 28. The activation pulse signal actpz is a signal that activates a row circuit, which controls word lines connected to a memory cell or a sense amp connected to bit lines, and a column circuit, which controls column gates connected to a data bus.

The refresh controller 27 is a so-called arbiter. The refresh controller 27 determines whether to select (give priority to) an internal refresh request (self-refresh request signal srtz) or an access request (activation signal atdpz) from an external device and generates a determination signal refz based on the determination. The determination signal refz is provided to the row address generator 28.

The row address generator 28 generates a base signal rasz of the word line selection signal based on the determination signal refz and the activation pulse signal actpz. When the refresh controller 27 selects an internal refresh request, the word line corresponding to the refresh address is activated based on the base signal rasz. When the external access request is selected, the word line corresponding to the external address signal Add is activated based on the base signal rasz. The refresh address is generated by an address counter (not shown).

The operation of the DRAM 100 will now be discussed.

When Responding to an External Access Request

FIG. 2 is a waveform chart taken when responding to an access request from an external device.

When the chip enable signal /CE1 goes low, the detection signals oerex, werex, cerex of the respective transition detectors 17, 18, 19 are output. Then, the ATDS generator 25 generates the activation signal atdpz. The main signal mpealz is generated based on the activation signal atdpz, and the activation pulse signal actpz is generated based on the main signal mpealz.

When responding to an external access request, the self-refresh request signal srtz is low. Thus, the determination signal refz remains unchanged (low level). The activation pulse signal generator 21 generates the activation pulse signal actpz and the write signal wrtz or the read signal redz based on the main signal mpealz from the external active latch generator 26 and the control signals wrz, rdz from the control decoder 20. The write signal wrtz indicates the write mode, and the read signal redz indicates the read mode. The level of the control signals (/WE, /OE) determines which one of the write signal wrtz and the read signal redz is to be generated.

The row address generator 28 generates the base signal rasz, which selects the word lines, based on the activation pulse signal actpz. Since the circuit responding to the base signal rasz does not have a refresh request, the word line corresponding to the external address signal Add is selected.

When Selecting a Refresh Request

FIG. 3 is a waveform chart taken when the refresh request and the external access request overlap each other and the refresh request is selected.

When the refresh request is selected, the refresh controller 27 compares the activation signal atdpz and the internal refresh request signal srtz. If the refresh request signal srtz is earlier than the activation signal atdpz, the refresh controller 27 outputs the determination signal refz at a high level. Thus, the row address generator 28 gives priority to the internal refresh request and generates the base signal rasz to activate the word line corresponding to the internal refresh address.

Then, when the refresh operation is completed, the row address generator 28 generates the base signal rasz based on the activation pulse signal actpz. This activates the word line corresponding to the external address signal Add.

Accordingly, when priority is given to the internal refresh operation, the refresh controller 27 generates the base signal rasz, which activates the word line selected in correspondence with the external address signal Add.

When Selecting the External Access Request

FIG. 4 is a waveform chart taken when the refresh request and the external access request overlap each other and the external access request is selected.

When the refresh controller 27 determines that the refresh request signal srtz is delayed from the activation signal atdpz, the refresh controller 27 outputs the determination signal refz at a low level. Thus, the row address generator 28 gives priority to the external access request and generates the base signal rasz to activate the word line corresponding to the external address signal Add.

Then, when the external access operation is completed, the row address generator 28 generates the base signal rasz based on the refresh request signal srtz. This activates the word line corresponding to the internal refresh address.

In this manner, a memory (DRAM), which automatically performs a refresh operation in a device, basically gives priority to the internal refresh operation to hold the information of a memory cell when the internal refresh request and the access request from the external device overlap each other. This is because the internal refresh request timing (refresh interval) is determined by the memory holding capacity (data holding time) of the memory cell.

Accordingly, when the internal refresh request and the access request from the external device overlap each other, the response time of the device relative to the external access request is the sum of the normal time required for the external device to perform an access operation and the time required to perform the internal refresh operation. Accordingly, the time required by the device to respond to the external access request is about two times longer than when the external access request and the internal refresh request do not overlap each other. The increase in the response time makes it difficult to increase the speed of the device.

SUMMARY OF THE INVENTION

It is an object of the present invention to provide a control circuit that increases the speed of a device to respond to a control request from an external device when an internal control request of the device overlaps the external control request and to provide a semiconductor device including such control circuit.

To achieve the above object, the present invention provides a control circuit connected to an internal circuit of a semiconductor device. The control circuit generates a main signal based on a first control signal and a second control signal to control the internal circuit. The control circuit includes a first signal processing unit for receiving the first control signal and generating a first processed signal from the first control signal. The first signal processing unit includes a filter for filtering the first control signal. A second signal processing unit receives the first control signal and generates a second processed signal. An arbiter receives the second processed signal and the second control signal, determines which one of the second processed signal and the second control signal is to be given priority, and generates a determination signal based on the determination. A main signal generator is connected to the first signal processing circuit and the arbiter to generate the main signal from the determination signal or the first processed signal in accordance with the determination signal.

A further perspective of the present invention is a semiconductor memory device for performing a self-refresh operation based on an internal refresh request signal. The device has a first detection unit including a filter for receiving an external access request signal and eliminating a noise component from the external access request signal. The first detection unit detects transition of an output signal of the filter and generates a first detection signal based on the detection. A second detection unit receives the external access request signal, detects transition of the external access request signal, and generates a second detection signal based on the detection. An arbiter is connected to the second detection unit to generate a determination signal based on the second detection signal and the internal refresh request signal. The determination signal indicates which one of the external access request and the internal refresh request is to be given priority. A main signal generator is connected to the first detection unit and the arbiter to generate a main signal from the first detection signal or the determination signal in accordance with the determination signal to control the internal circuit of the device.

A further perspective of the present invention is a semiconductor memory device for performing a self-refresh operation based on an internal refresh request signal. The device has a first detection unit including a first filter for receiving an external access request signal and eliminating a noise component from the external access request signal. The first detection unit detects transition of an output signal of the first filter and generates a first detection signal based on the detection. A second detection unit receives the external access request signal, detects transition of the external access request signal, and generates a second detection signal based on the detection. A first address transition detection unit includes a second filter for receiving an external address signal and eliminating a noise component from the external address signal. The first address transition detection unit detects transition of an output signal of the second filter and generates a first address detection signal based on the detection. A second address transition detection unit receives the external address signal, detects transition of the external address signal, and generates a second address detection signal based on the detection. A first signal synthesizing circuit is connected to the first detection unit and the first address transition detection unit to perform a logical operation with the first detection signal and the first address detection signal and generate a first synthesizing signal based on a result of the logical operation. A second signal synthesizing circuit is connected to the second detection unit and the second address transition detection unit to perform a logical operation with the second detection signal and the second address detection signal and generate a second synthesizing signal based on a result of the logical operation. An arbiter is connected to the second signal synthesizing circuit to perform a logical operation with the second synthesizing signal and the internal refresh request signal and generate a determination signal based on a result of the logical operation. The determination signal indicates which one of the external access request and the internal refresh request is to be given priority. A main signal generator is connected to the first signal synthesizing circuit and the arbiter to generate a main signal from the first detection signal or the determination signal in accordance with the determination signal to control the internal circuit of the device.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 21 is a waveform chart of the device of FIG. 19.

DETAILED DESCRIPTION OF THE PREFERRED EMBODIMENTS

Figure 1:
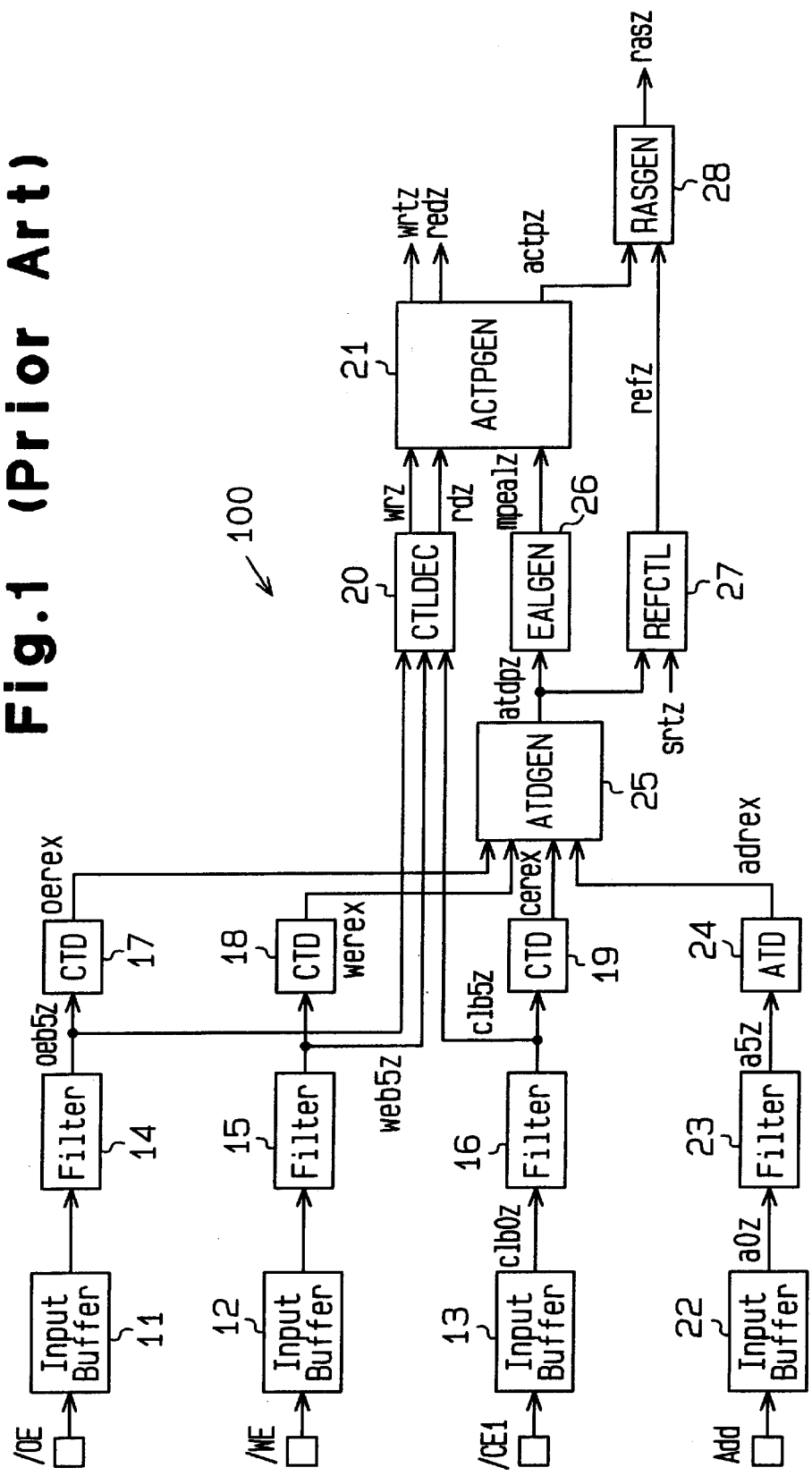
FIG. 1 is a schematic block circuit diagram showing a prior art semiconductor memory device.
Figure 2:
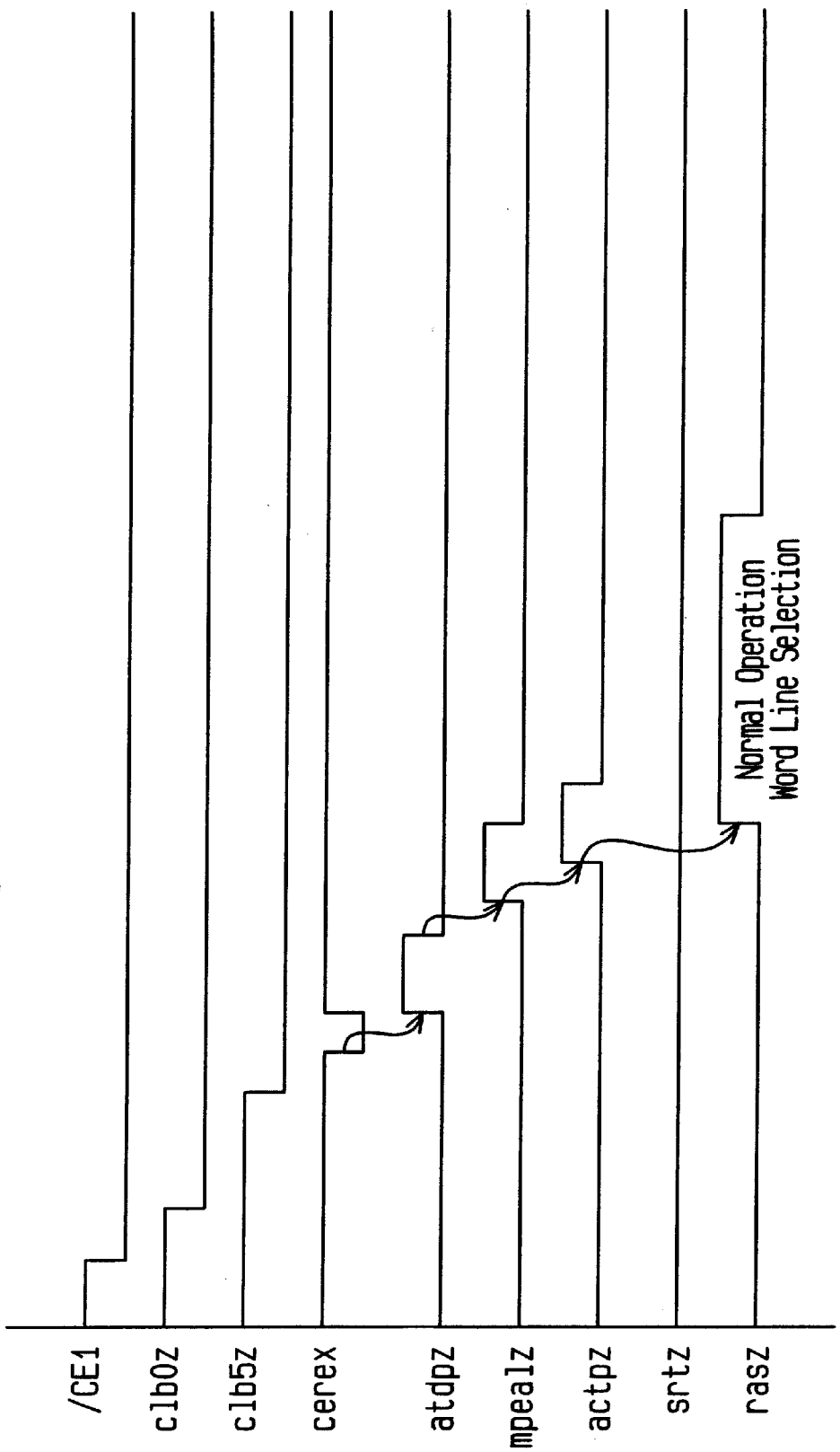
FIG. 2 is a timing waveform chart showing the operation of the semiconductor memory device of FIG. 1.
Figure 3:
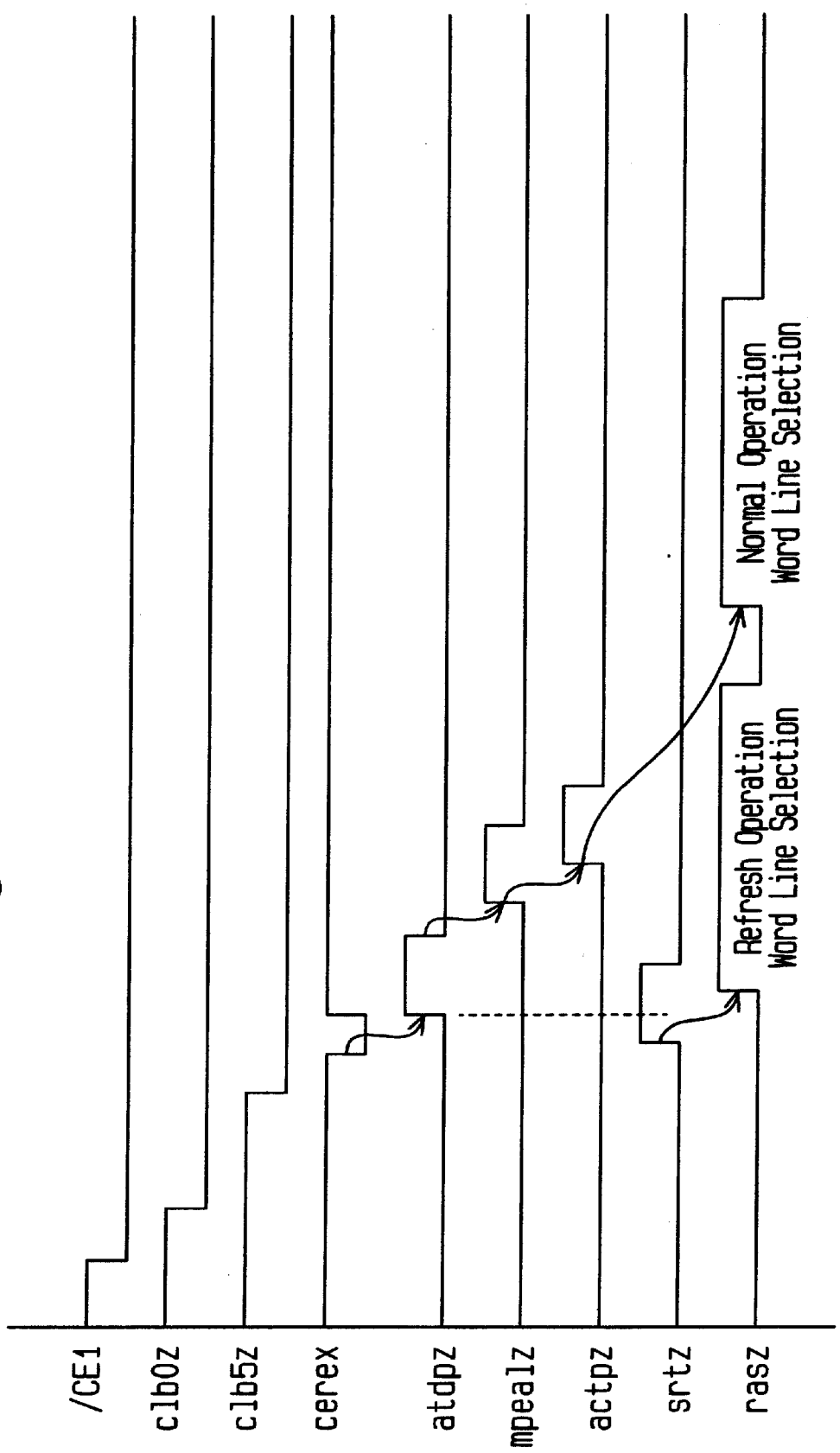
FIG. 3 is a timing waveform chart showing the operation of the semiconductor memory device of FIG. 1.
Figure 4:
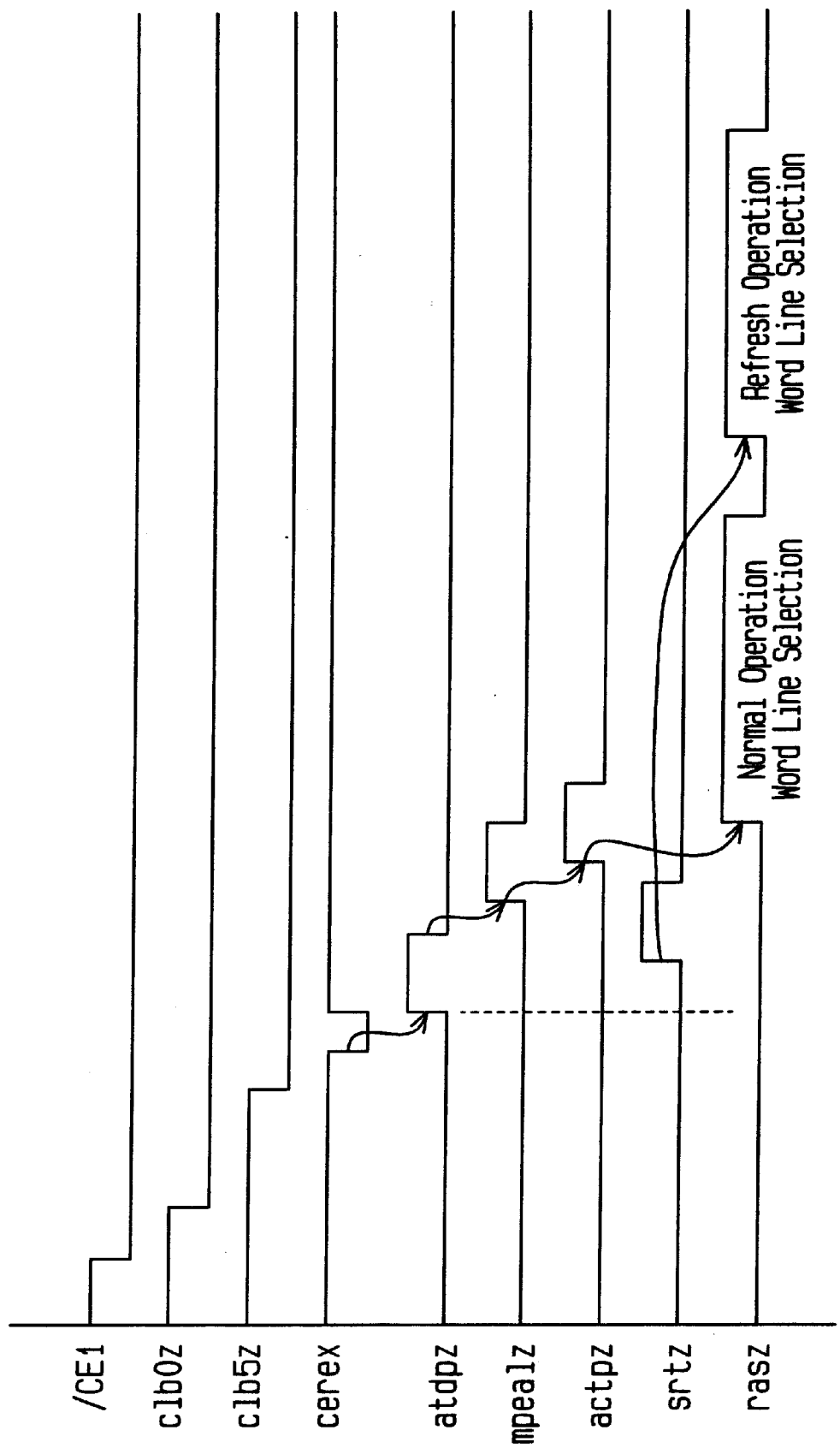
FIG. 4 is a timing waveform chart showing the operation of the semiconductor memory device of FIG. 1.

In the drawings, like numerals are used for like elements throughout.

First Embodiment

Figure 5:
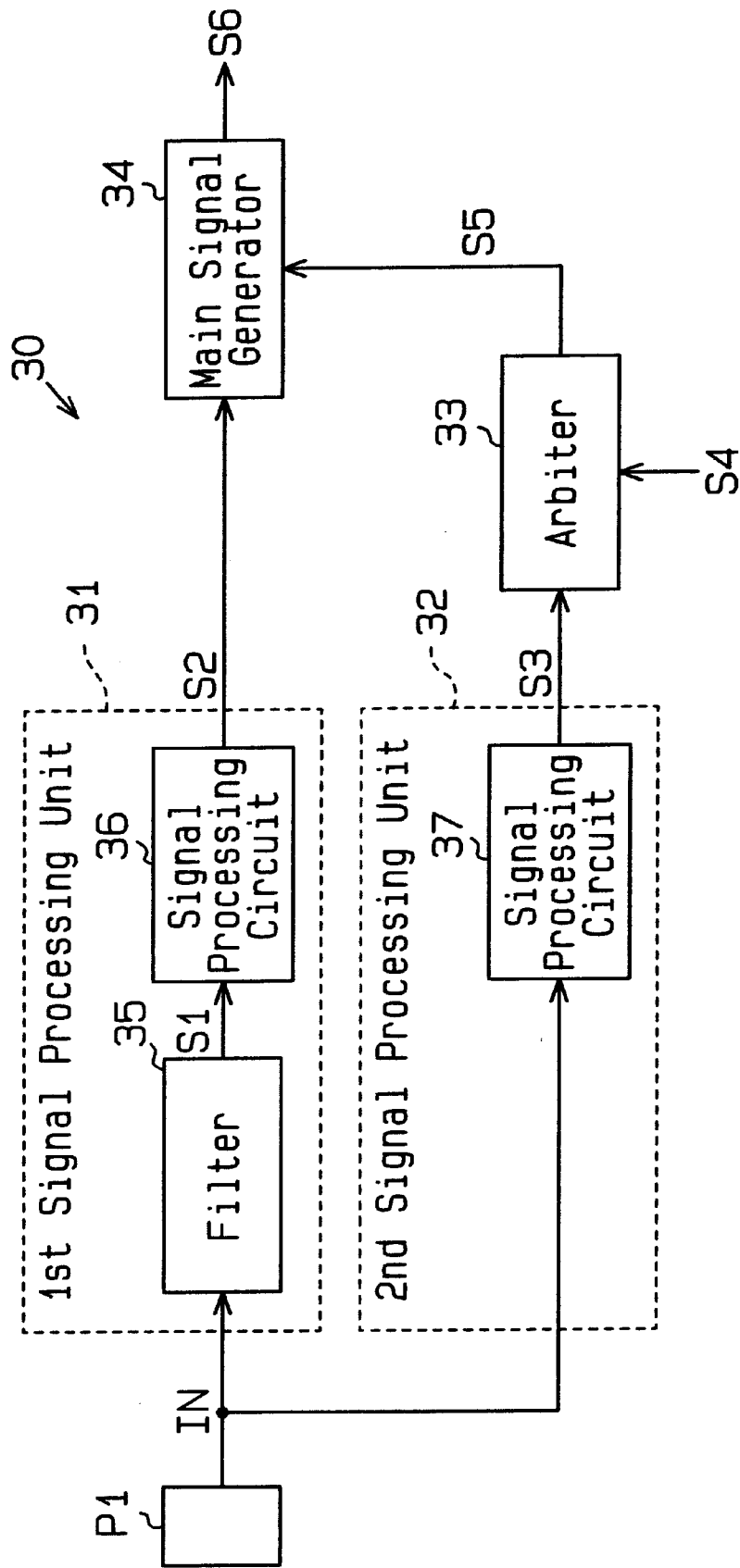
FIG. 5 is a schematic block circuit diagram of a controller according to a first embodiment of the present invention.

FIG. 5 is a schematic block circuit diagram of a control circuit according to a first embodiment of the present invention. The control circuit is applied to an input circuit section 30 of a semiconductor device. The input circuit 30 includes first and second signal processing units 31, 32, an arbiter 33, and a main signal generator 34.

The first and second signal processing units 31, 32 are connected to the same external terminal P1 and receive an input signal (first control signal) IN via the external terminal P1. The input signal IN is an external request signal that causes an internal circuit (not shown) of the semiconductor device to perform a predetermined process.

The first signal processing unit 31 includes a filter 35 and a signal processing circuit 36. The filter 35 performs a predetermined filtering process on the input signal IN to generate a noise-eliminated signal S1 from which noise components, such as a glitch, have been eliminated. The noise elimination signal S1 is provided to the signal processing circuit 36.

The signal processing circuit 36 performs a predetermined signal process on the noise-eliminated signal S1 to generate a first output signal (first processed signal) S2. The first output signal S2 is provided to the main signal generator 34.

The second signal processing unit 32 includes a signal processing circuit 37. The signal processing circuit 37 performs a predetermined signal process on the input signal and generates a second output signal (second processed signal) S3. The second output signal S3 is provided to the arbiter 33. The structure of the signal processing circuit 37 is the same as that of the signal processing circuit 36.

The arbiter 33 receives a first signal (second control signal) S4 and the second output signal S3. The first signal S4 is an internal request signal generated by the signal generator to cause an internal circuit of the semiconductor device to perform a predetermined process. The arbiter 33 determines whether to give priority to the first signal S4 or to the second output signal S3 and generates a determination signal S5 based on the determination. The determination signal S5 is provided to the main signal generator 34. The arbiter 33, for example, performs a logical operation with the first signal S4 and the second output signal S3 to generate a determination signal S5.

The main signal generator 34 receives the first output signal S2 and the determination signal S5 to perform a logical operation with the two signals S2, S5 and generate a main signal S6.

The waveform of the first output signal S2 is substantially the same as that of the second output signal S3. Accordingly, in the arbiter 33, a determination result similar to that when using the first output signal S2 is obtained from the second output signal S3.

Since the first signal processing unit 31 includes the filter 35, the first output signal S2 is generated after the second output signal S3. Accordingly, the arbiter 33 generates the determination signal S5 using the second output signal S3 to perform a determination earlier than when using the first output signal S2.

The main signal generator 34 generates the main signal by performing a logical operation with the determination signal S5 from the arbiter 33 and the first output signal S2. Accordingly, the main signal S6 is generated earlier than when the arbiter 33 performs a determination using the first output signal S2. Thus, the internal circuit of the semiconductor device is quickly operated based on the main signal S6.

The input circuit section (control circuit) 30 of the semiconductor memory device of the first embodiment has the advantages described below.

(1) The arbiter 33 of the input circuit section 30 receives the second output signal S3 via the second signal processing unit 32, which does not include a filter. The arbiter 33 determines whether to put priority on the second output signal S3 or the first signal S4 and generates the determination signal S5 based on the determination. The determination signal S5 is generated earlier than when generated based on the first output signal S2 of the first signal processing unit 31, which includes a filter. The main signal generator 34 generates the main signal S6 based on the determination signal S5 and provides the main signal S6 to the internal circuit of the semiconductor memory device. Thus, the internal circuit of the semiconductor device is operated earlier than when the arbiter 33 performs a determination based on the first output signal.

Second Embodiment

Figure 6:
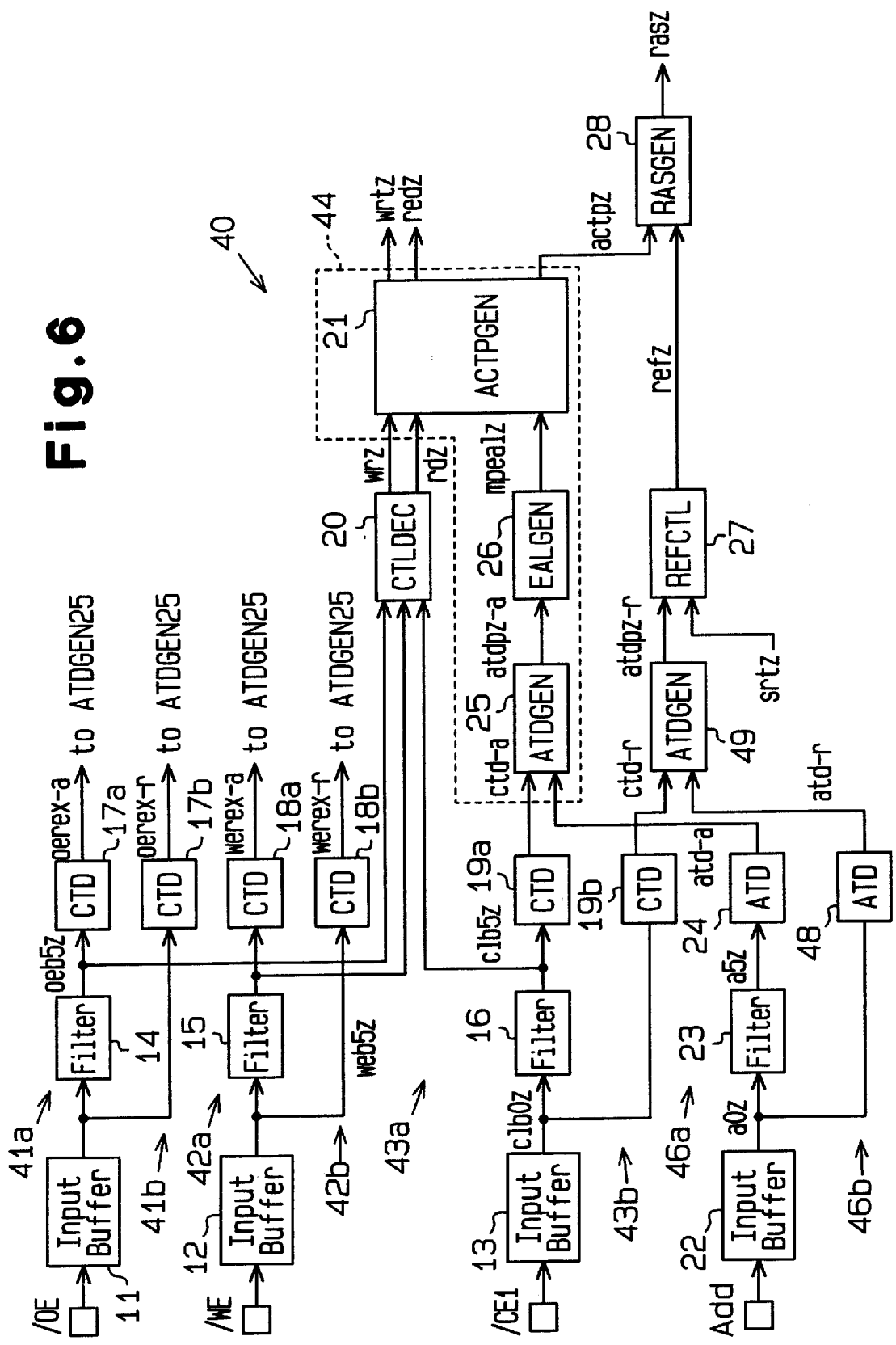
FIG. 6 is a schematic block circuit diagram of a semiconductor memory device according to a second embodiment of the present invention.

FIG. 6 is a block circuit diagram showing an input circuit section of a DRAM 40 provided with a function for automatically performing refreshing in a device.

The DRAM 40 receives an output enable signal /OE, a write enable signal /WE, and a chip enable signal /CE1, which are control signals. The signals /OE, /WE, /CE1 are provided to input buffers (input initial stage circuits) 11, 12, 13, respectively.

The first input buffer 11 converts the input signal /OE to a signal having a level corresponding to the internal voltage of the device and provides the level-converted input signal /OE to a first transition detection unit (first detection unit) 41a and a second transition detection unit (second detection unit) 41b. In the same manner, the second input buffer 12 provides the level-converted input signal /WE to a third transition detection unit (first detection unit ) 42a and a fourth transition detection unit (second detection unit) 42b. The third input buffer 13 converts the input signal /CE1 to a signal clb0z having a level corresponding to the internal voltage of the device and provides the level-converted input signal clb0z to a fifth transition detection unit (first detection unit) 43a and a sixth transition detection unit (second detection unit) 43b.

Figure 7:
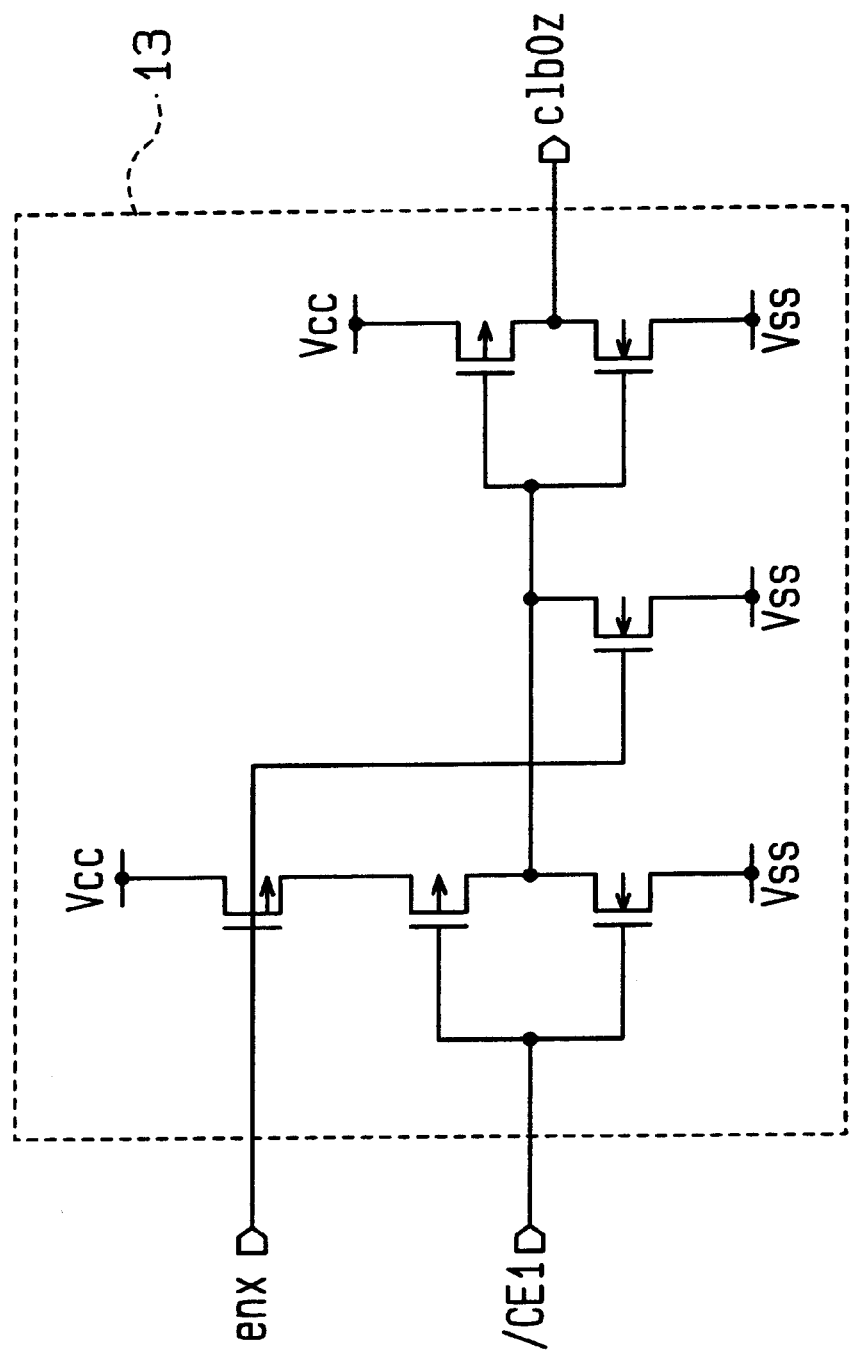
FIG. 7 is a circuit diagram of an input buffer used in the device of FIG. 6.

FIG. 7 is a circuit diagram showing an example of the third input buffer. An enable signal enx is provided from an input buffer, which receives a second chip enable signal CE2 (not shown) from an external device. The third input buffer 13 receives an external signal (chip enable signal /CE1) when the enable signal enx is low. The third input buffer 13 converts the chip enable signal /CE1 to a level corresponding to the internal voltage and generates a conversion enable signal clb0z. The configuration of the first and second input buffers 11, 12 is the same as that of the third input buffer 13.

The first transition detection unit 41a includes a first request signal filter (first filter) 14 and a first transition detector 17a. The first request signal filter 14 eliminates noise components, such as a glitch, from the signal received from the first input buffer 11 and generates a noise-eliminated signal oeb5z. The noise-eliminated signal oeb5z is provided to the first transition detector 17a and a control decoder 20. The first transition detector 17a detects the transition of the noise-eliminated signal oeb5z and generates a first control transition detection signal (first detection signal) oerex-a. The first control transition detection signal oerex-a is provided to a first signal synthesizing circuit 44 or a first transition detection signal generator (first ATDGEN) 25.

The second transition detection unit 41b includes a second transition detector 17b. The second transition detector 17b detects the transition of a signal provided from the first input buffer 11 and generates a second control transition detection signal (second detection signal) oerex-r. The second control transition detection signal oerex-r is provided to a second transition detection signal generator (second ATDGEN or second signal synthesizing circuit) 49.

The second transition detector 17b has the same configuration as the first transition detector 17a. Accordingly, the waveform of the second control transition detection signal oerex-r is substantially the same as that of the first control transition detection signal oerex-a and is output before the detection signal oerex-a.

The third transition detection unit 42a includes a second request signal filter (first filter) 15 and a third transition detector 18a. The second request signal filter 15 eliminates noise components from the signal received from the second input buffer 12 and generates a second noise-eliminated signal web5z. The second noise-eliminated signal web5z is provided to the third transition detector 18a and the control decoder 20. The third transition detector 18a detects the transition of the second noise-eliminated signal web5z and generates a third control transition detection signal (first detection signal) werex-a. The third control transition detection signal werex-a is provided to the first ATDGEN 25.

The fourth transition detection unit 42b includes a fourth transition detector 18b. The fourth transition detector 18b detects the transition of a signal provided from the second input buffer 12 and generates a fourth control transition detection signal (second detection signal) werex-r. The fourth control transition detection signal werex-r is provided to the second ATDGEN 49.

The fourth transition detector 18b has the same configuration as the third transition detector 18a. Accordingly, the waveform of the fourth control transition detection signal werex-r is substantially the same as that of the third control transition detection signal werex-a and is output before the detection signal werex-a.

The fifth transition detection unit 43a includes a third request signal filter (first filter) 16 and a fifth transition detector 19a. The third request signal filter 16 eliminates noise components from the signal received from an external device and generates a third noise-eliminated signal clb5z. The third noise-eliminated signal clb5z is provided to the fifth transition detector 19a and the control decoder 20.

Figure 8:
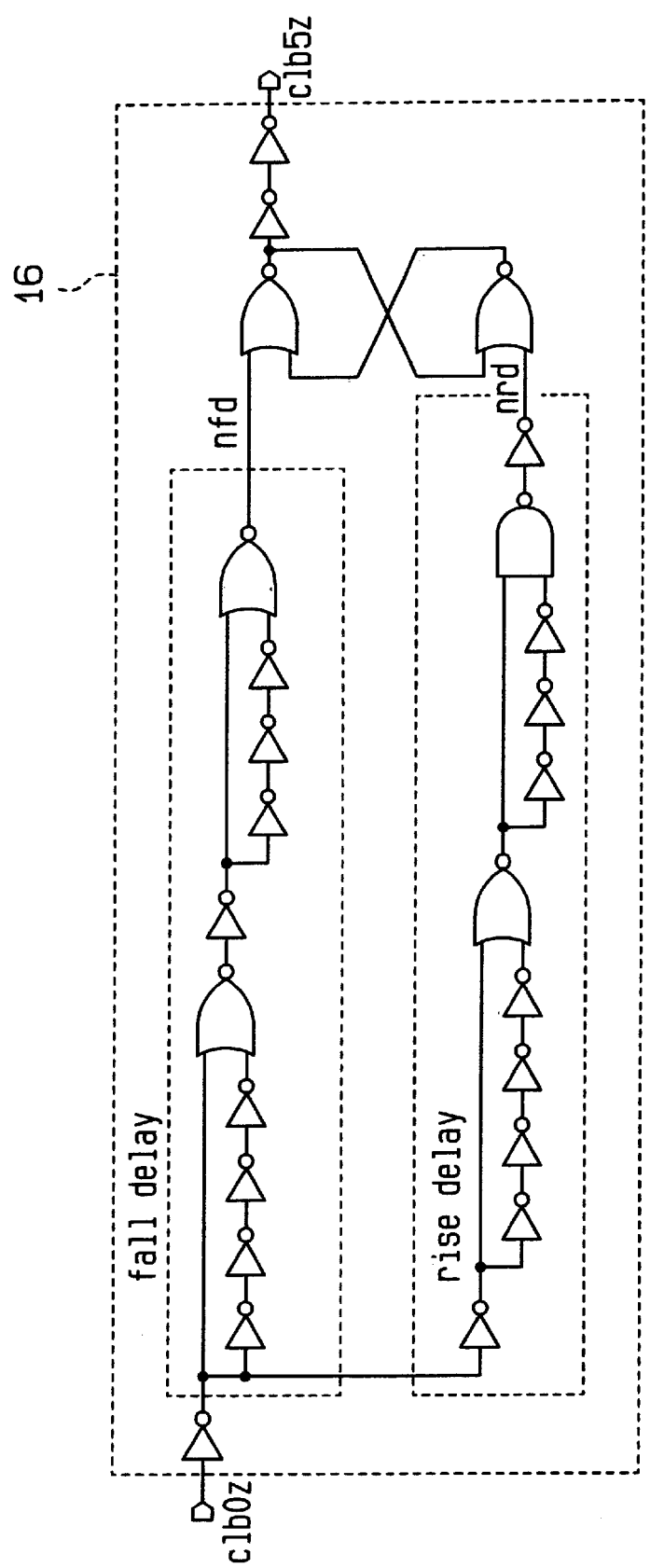
FIG. 8 is a schematic circuit diagram of a filter used in the device of FIG. 6.
Figure 9:
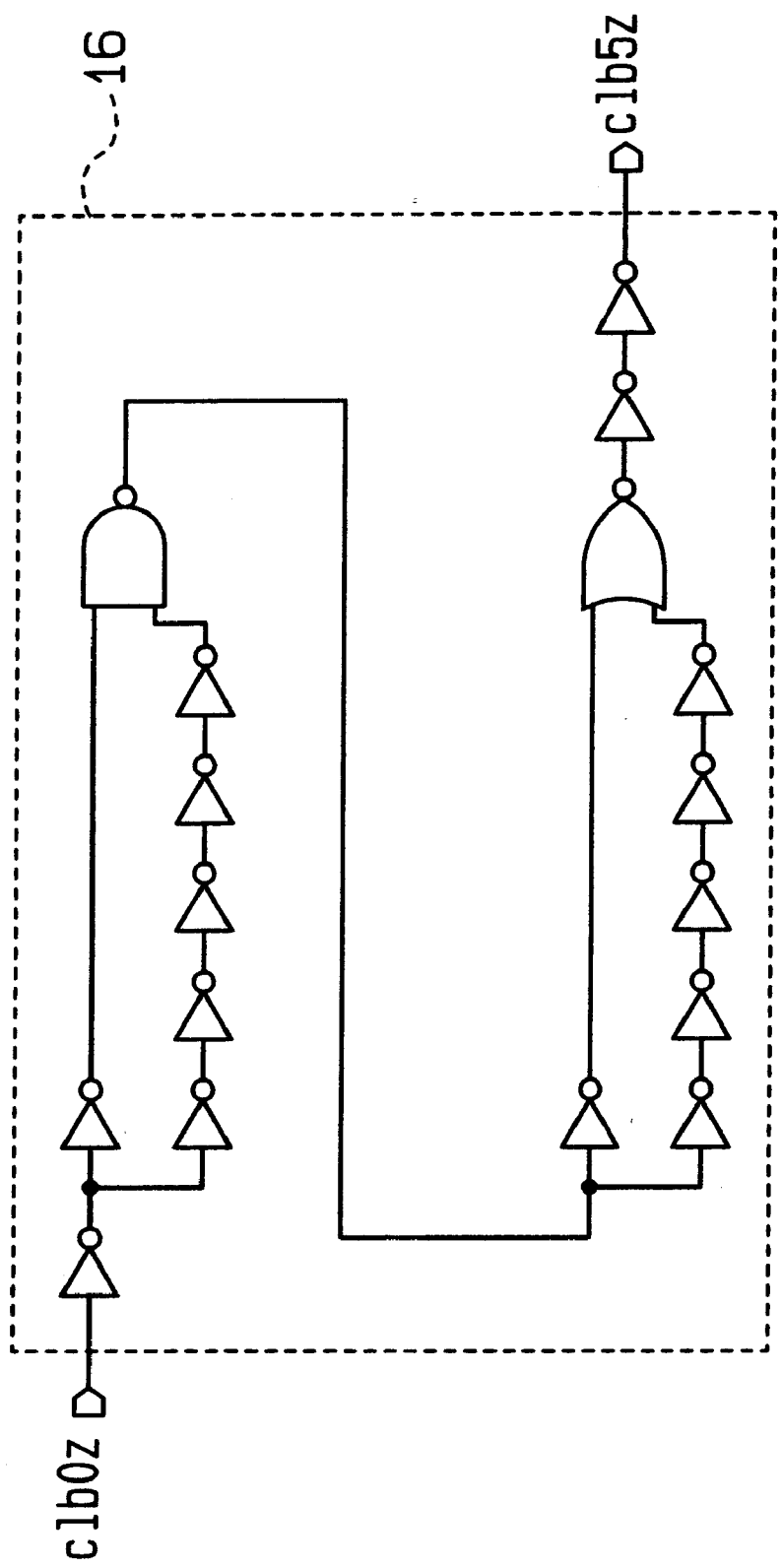
FIG. 9 is a schematic circuit diagram of another filter used in the device of FIG. 6.

FIG. 8 is a circuit diagram illustrating an example of the third request signal filter 16. The configuration of the first and second request signal filters 14, 15 is the same as that of the third request signal filter 16. The filters 14–16 may be configured as shown in FIG. 9.

Figure 10:
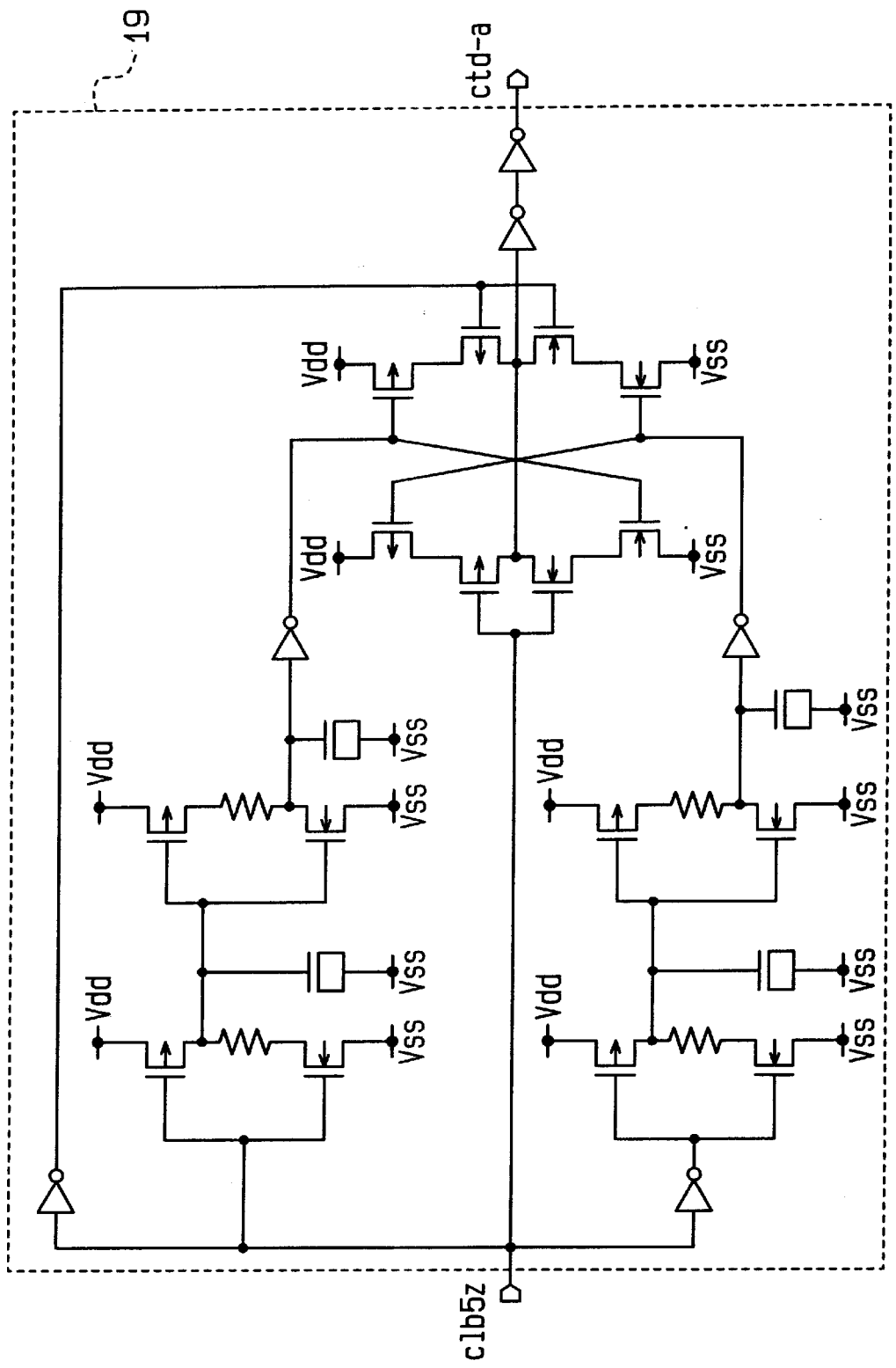
FIG. 10 is a schematic circuit diagram of a transition detector used in the device of FIG. 6.

FIG. 10 is a circuit diagram showing an example of the fifth transition detector 19a. The fifth transition detector 19a detects the transition of the input signal clb5z and generates a fifth control transition detection signal (first detection signal) ctd-a. The detection signal ctd-a is provided to the first ATDGEN 25. When the input signal clb5z shifts from a high level to a low level or shifts from a low level to a high level, the fifth transition detector 19a generates a one-shot pulse detection signal ctd-a. The configuration of the first, second, third, and fourth transition detectors 17a, 17b, 18a, 18b is the same as that of the fifth transition detector 19a.

The sixth transition detection unit 43b includes a sixth transition detector 19b. The sixth transition detector 19b detects the transition of the input signal clb0z and generates a sixth control transition detection signal (second detection signal) ctd-r. The sixth control transition detection signal ctd-r is provided to the second ATDGEN 49.

The sixth transition detector 19b has the same configuration as the fifth transition detector 19a. Accordingly, the waveform of the sixth control transition detection signal ctd-r is substantially the same as that of the fifth control transition detection signal ctd-a and is output before the detection signal ctd-a.

An input buffer 22 receives an external address signal Add, which has a plurality of bits. The configuration of the input buffer 22 is the same as that of the first to third input buffers 11–13. The input buffer 22 has the same configuration as the first to third input buffers 11–13. The input buffer 22 converts the external address signal to a level corresponding to the internal voltage of the device and generates a level-converted signal a0z. The level-converted signal a0z is provided to the first and second address transition detection units 46a, 46b.

The first address transition detection unit 46a includes a filter (second filter) 23 and a first address transition detector 24. The configuration of the filter 23 is the same as that of the first to third request signal filters 14–16. The filter 23 eliminates noise components from the level-converted signal a0z and generates a fourth noise-eliminated signal a5z. The fourth noise-eliminated signal a5z is provided to the first address transition detector 24. The configuration of the first address transition detector 24 is the same as that of the transition detectors 17a, 17b–19a, 19b. The first address transition detector 24 detects the transition of the noise-eliminated signal a5z and generates a first address detection signal atd-a. The detection signal atd-a is provided to the first ATDGEN 25.

The second address transition detection unit 46b includes a second address transition detector 48. The second address transition detector 48 detects the transition of the level-converted signal a0z and generates a second address detection signal adt-r. The second address detection signal atd-r is provided to the second ATDGEN 49.

The configuration of the second address transition detector 48 is the same as that of the first address transition detector 24. Accordingly, the second address detection signal atd-r has the same waveform as the first address detection signal atd-a and is output before the detection signal atd-a.

The first signal synthesizing circuit 44 includes the first transition detection signal generator (ATDGEN) 25, an external active latch generator 26, and an activation pulse signal generator 21.

Figure 11:
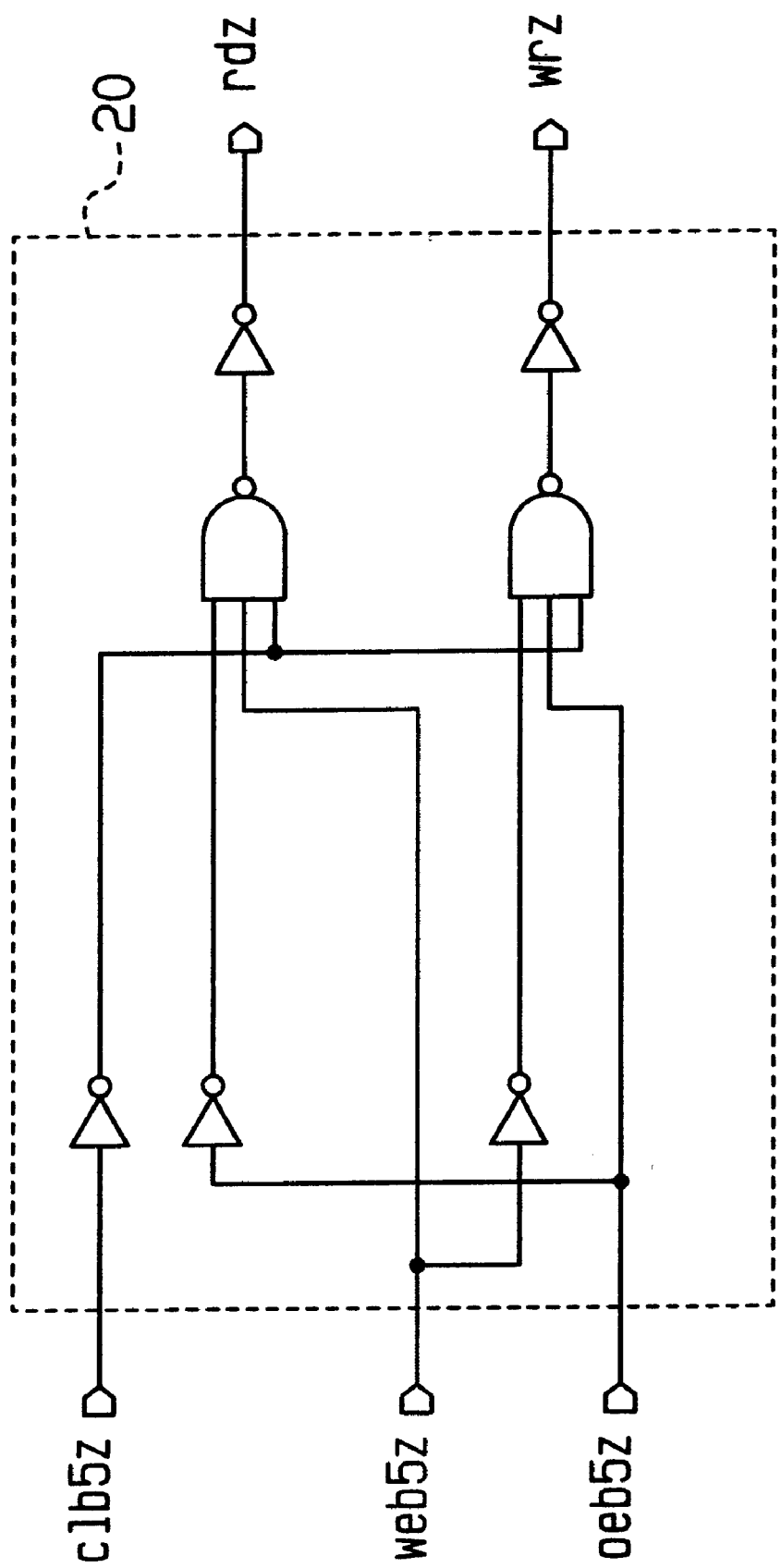
FIG. 11 is a schematic circuit diagram of a control decoder used in the device of FIG. 6.

FIG. 11 is a circuit diagram illustrating an example of the control decoder 20. FIG. 11 shows a circuit that generates a write control signal wrz, which corresponds to a write command, and a read control signal rdz, which corresponds to a read command. The control decoder 20 performs a logical operation with the signals oeb5z, web5z, clb5z from the first to third request signal filters 11–13 and generates the write control signal wrz and the read control signal rdz.

Figure 12:
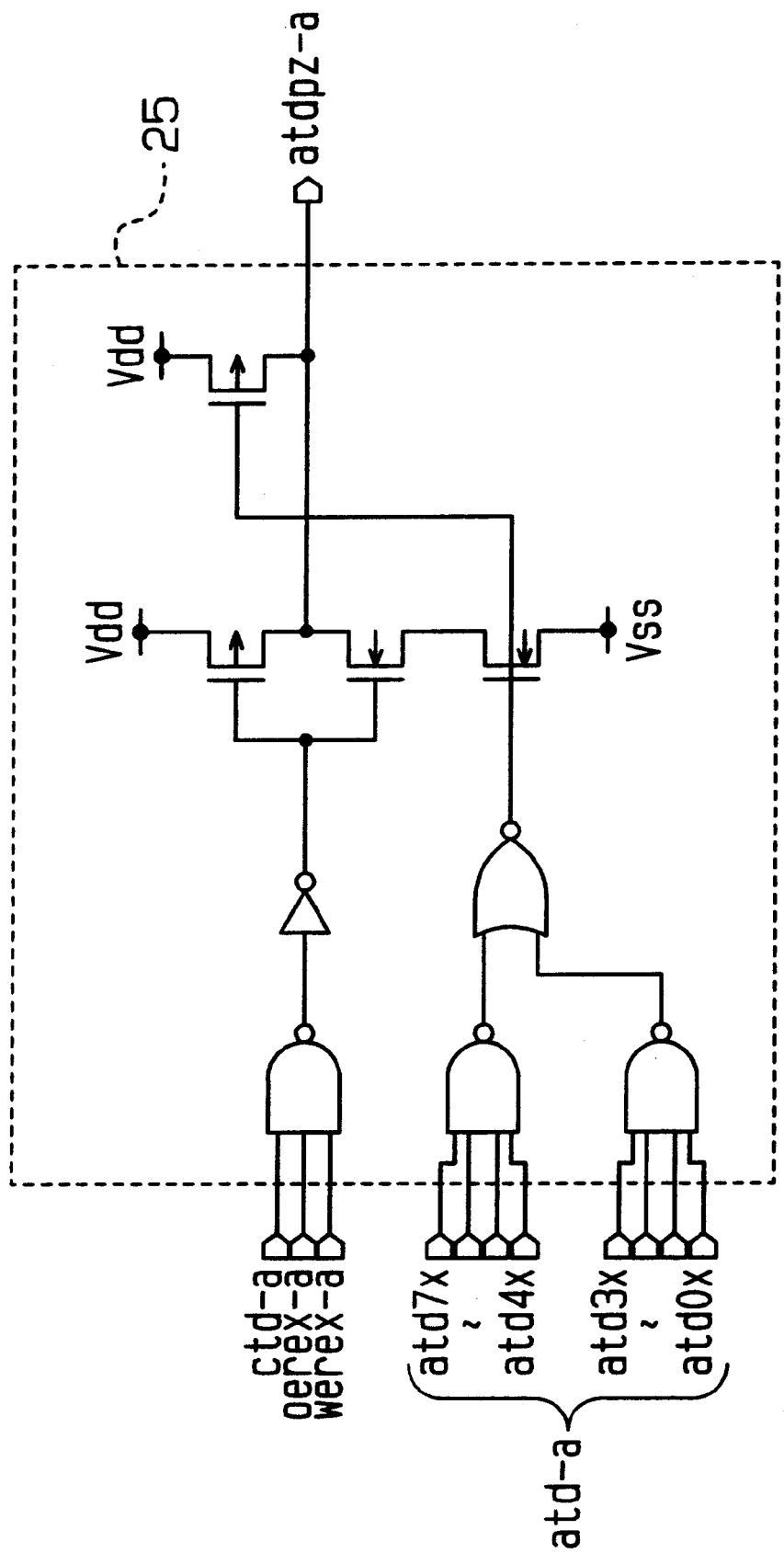
FIG. 12 is a schematic circuit diagram of a transition detection signal generator used in the device of FIG. 6.

FIG. 12 illustrates an example of a first transition detection signal generator 25. The first transition detection signal generator 25 performs a logical operation with the detection signals oerex-a, werex-a, ctd-a, atd-a and generates a first activation signal atdpz-a. The first activation signal atdpz-a is provided to the latch generator 26. Signals atd0x–atd7x are the lower eight bits of the first address transition detector 24.

Figure 13:
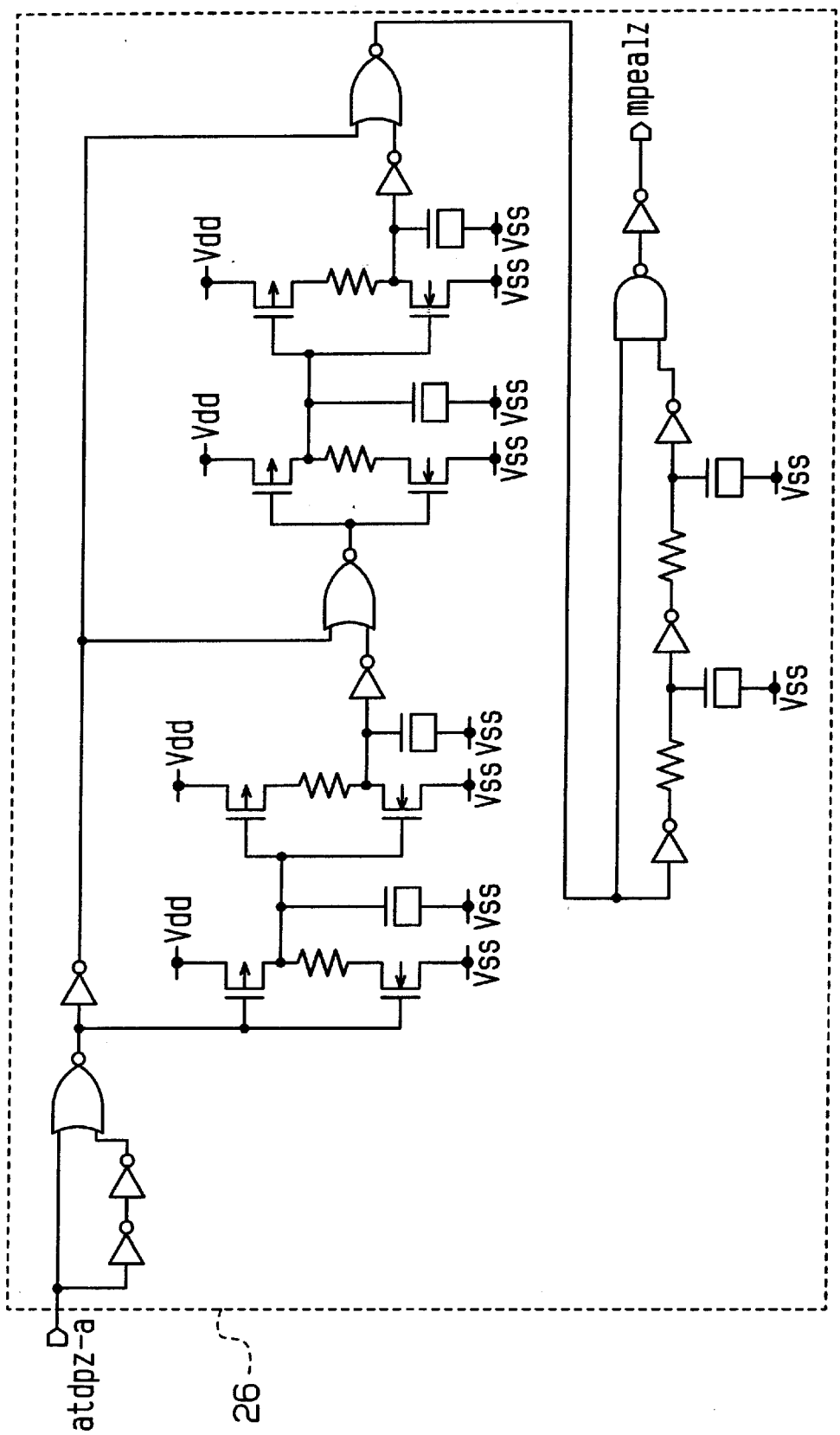
FIG. 13 is a schematic circuit diagram of an external active latch generator used in the device of FIG. 6.

FIG. 13 is a circuit diagram illustrating an example of the external active latch generator 26. The latch generator 26 generates a main signal mpealz to activate the device based on the first activation signal atdpz-a and provides the main signal mpealz to the activation pulse signal generator 21.

Figure 14:
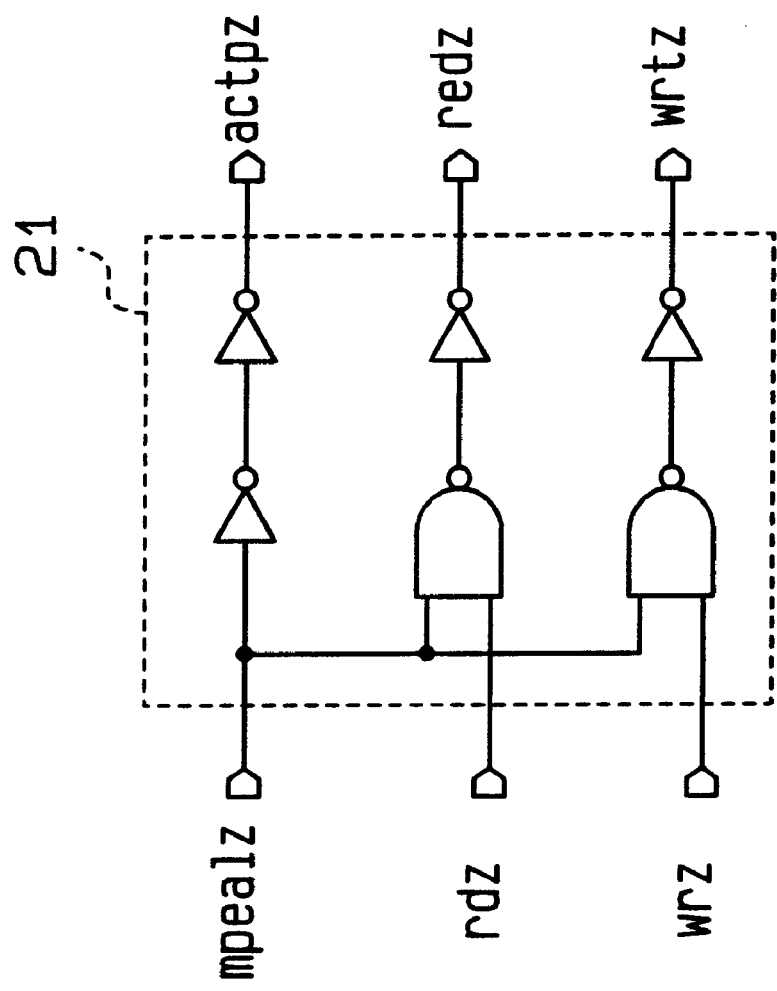
FIG. 14 is a schematic circuit diagram of an active pulse generator used in the device of FIG. 6.

FIG. 14 is a circuit diagram illustrating an example of the activation pulse signal generator 21. The activation pulse signal generator 21 generates the write signal wrtz, a read signal redz, and an activation pulse signal actpz. The activation pulse signal actpz is provided to a row address generator 28.

The second transition detection signal generator (second signal synthesizing circuit) 49 performs a logical operation with the detection signals oerex-r, werex-r, ctd-r, atd-r and generates a second activation signal atdpz-r. The second activation signal atdpz-r is provided to the refresh controller (arbiter) 27.

The configuration of the second transition detection signal generator 49 is the same as that of the first transition detection signal generator 25. Accordingly, the first and second activation signals atdpz-a, atdpz-r output from the first and second transition detection signal generators 25, 49 have the same waveform. Since the second activation signal atdpz-r does not pass through the filter 16, the second activation signal atdpz-r is output earlier than the first activation signal atdpz-a. That is, the second transition detection signal generator 49 performs a logic operation before the first transition detection signal generator 25.

Figure 15:
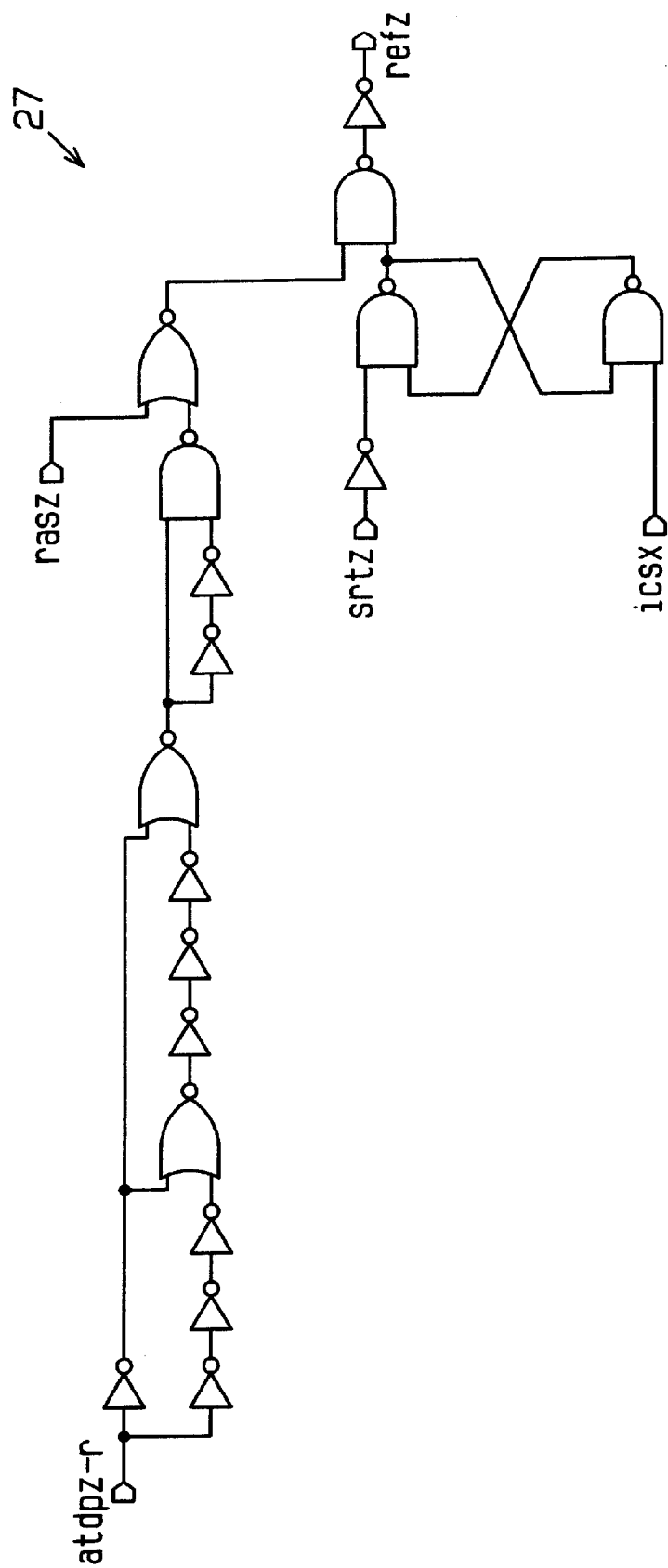
FIG. 15 is a schematic circuit diagram of a refresh controller used in the device of FIG. 6.

FIG. 15 is a circuit diagram illustrating an example of the refresh controller 27.

The refresh controller 27 determines whether to select (give priority to) an internal refresh request (self-refresh request signal srtz) or an access request (second activation signal atdpz-r) from an external device and generates a determination signal refz based on the determination. The determination signal refz is provided to the row address generator 28.

Figure 16:
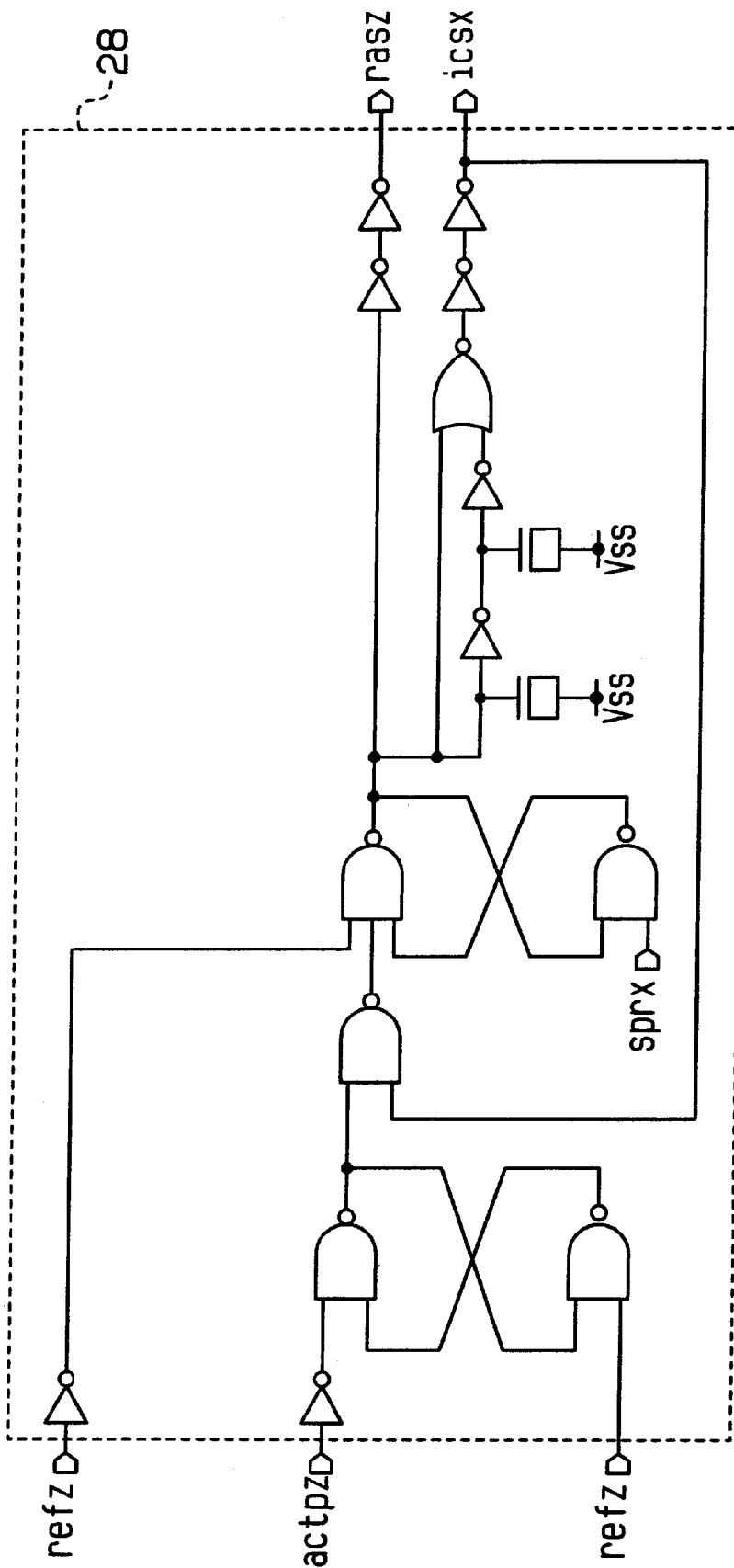
FIG. 16 is a schematic circuit diagram of a row address generator used in the device of FIG. 6.

FIG. 16 illustrates an example of the row address generator 28.

The row address generator 28 generates a base signal rasz of a word line selection signal based on the determination signal refz and the activation pulse signal actpz and provides the base signal rasz to an internal circuit (not shown) and the refresh controller 27. When the refresh controller 27 selects an internal refresh request, the word line corresponding to the refresh address, which is generated by an address counter (not shown), is activated based on the base signal rasz. When the external access request is selected, the word line corresponding to the external address signal Add is activated.

The row address generator 28 generates a signal icsx and provides the signal icsx to the refresh controller 27. Signal sprx, which is shown in FIG. 16, is provided to reset a flip-flop, which is formed by a NAND circuit, after a certain time elapses from when the base signal rasz is output.

In the second embodiment, the second activation signal atdpz-r is output before the first activation signal atdpz-a. Thus, the refresh controller 27 gives a determination earlier than in the prior art and quickly generates the determination signal refz. Accordingly, the base signal rasz is generated earlier than in the prior art. Thus, the word line corresponding to the refresh address or the external address signal Add is activated earlier than in the prior art and the external access time is shortened.

Figure 17:
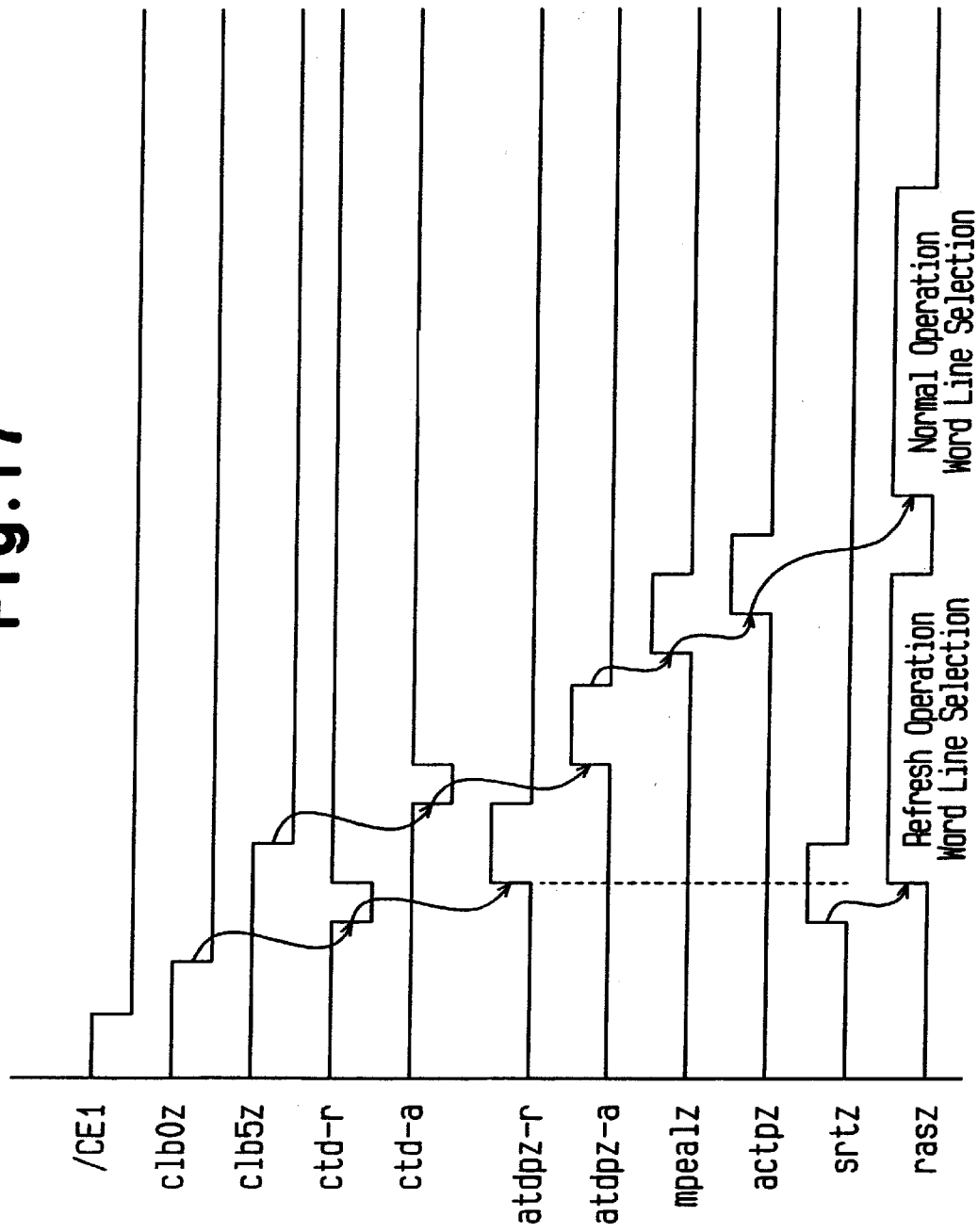
FIG. 17 is a waveform chart of the device of FIG. 6.

The operation of the DRAM 40 will now be discussed with reference to FIG. 17. FIG. 17 is a waveform chart taken when a refresh request overlaps a request from an external device and the refresh request is selected.

When the chip enable signal /CE1 goes low, the first, third, and fifth transition detection units 41a, 42a, 43a output detection signals oerex-a, werex-a, ctd-a, respectively. Further, the second, fourth, and sixth transition detection units 41b, 42b, 43b output detection signals oerex-r, werex-r, ctd-r, respectively. In the same manner, when the address signal Add changes (e.g., when the lowermost bit A<0> changes), the first address transition detection unit 46a outputs the detection signal atd-a and the second address transition detection unit 46b outputs the detection signal atd-r.

The first transition detection signal generator 25 performs a logical operation with the detection signals oerex-a, werex-a, ctd-a, atd-a and generates the first activation signal atdpz-a. The second transition detection signal generator 49 performs a logical operation with the detection signals oerex-r, werex-r, ctd-r, atd-r and generates the second activation signal atdpz-r.

The latch generator 26 generates the main signal mpealz, which activates the device based on the first activation signal atdpz-a. The refresh controller 27 compares the second activation signal atdpz-r and the internal refresh request signal srtz. Since the refresh request signal srtz is earlier than the second activation signal atdpz-r, the refresh controller 27 generates an active (e.g., high level) determination signal refz. The row address generator 28 gives priority to the internal refresh request and generates the base signal rasz to activate the word line corresponding to the internal refresh address.

The second activation signal atdpz-r is earlier than the first activation signal atdpz-a (the activation signal atdpz in the prior art example). Accordingly, the determination signal refz becomes active earlier than in the prior art example. Thus, even if the internal refresh request is generated at the same timing as in the prior art example, the refresh operation performed in response to the internal refresh request is started earlier than in the prior art.

When the refresh operation is completed, the row address generator 28 generates the base signal rasz based on the activation pulse signal actpz. The word line corresponding to the external address signal Add is activated based on the base signal rasz.

The internal refresh operation is started and completed earlier than in the prior art. Thus, the base signal rasz is generated based on the activation pulse signal actpz earlier than in the prior art. Accordingly, the time required for external access is shorter than in the prior art.

The DRAM of the second embodiment has the advantage described below.

The second activation signal atdpz-r provided to the refresh controller (arbiter) 27 is generated based on the detection signals oerex-r, werex-r, ctd-r, atd-r without being filtered. The refresh controller 27 compares the second activation signal atdpz-r and the refresh request signal srtz to generate the determination signal refz. The row address generator 28 generates the base signal rasz to activate a word line based on the determination signal refz. Thus, in comparison to when using a filtered detection signal, the base signal rasz is generated earlier and the internal refresh is started earlier. As a result, the external access is started earlier and the time required for external access is shortened.

Third Embodiment

Figure 18:
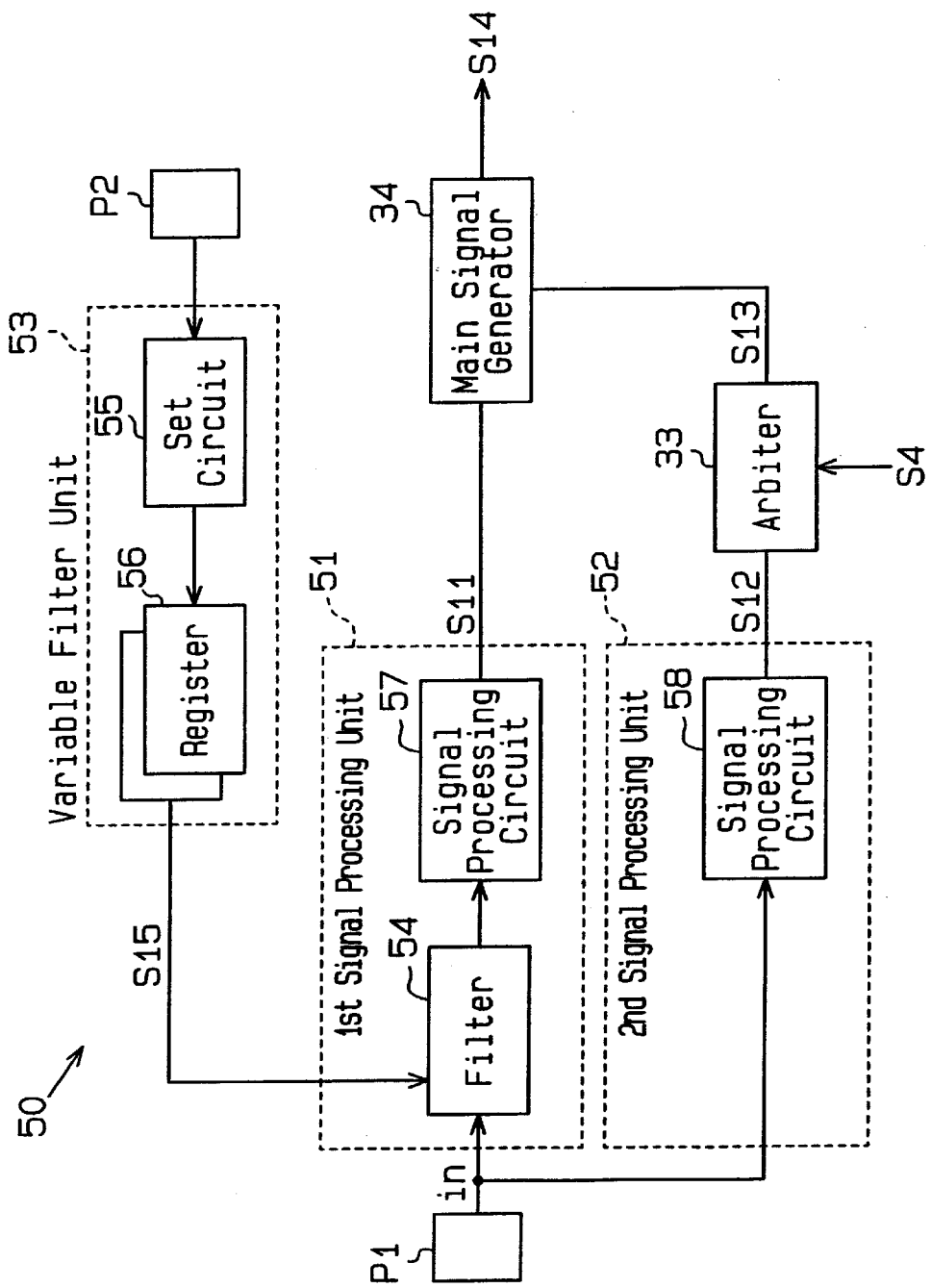
FIG. 18 is a schematic block circuit diagram of a controller according to a third embodiment of the present invention.

FIG. 18 is a schematic block circuit diagram illustrating a control circuit of according to a third embodiment of the present invention. The control circuit of the third embodiment is applied to an input circuit section 50 of a semiconductor memory device.

The input circuit section 50 includes first and second signal processing units 51, 52, an arbiter 33, a main signal generator 34, and a variable filter unit 53.

The first and second signal processing units 51, 52 are connected to the same external terminal P1 and receive an input signal IN via the external terminal P1. The input signal IN is an external request signal for performing a predetermined process in an internal circuit of the semiconductor memory device.

The first signal processing unit 51 includes a filter 54 and a first signal processing circuit 57. The filter 54 performs a predetermined filtering process on the input signal IN and generates a noise-eliminated signal S11 from which noise components, such as a glitch, has been eliminated.

The second signal processing unit 52 includes only a second signal processing circuit 58. The signal processing circuit 58 generates a second processed signal S12 based on the input signal IN and provides the second processed signal S12 to the arbiter 33. The configuration of the second signal processing circuit 58 is the same as that of the first signal processing circuit 57.

The arbiter 33 receives the first signal S4 and the second processed signal S12. The first signal S4 is an internal request signal generated by a predetermined signal generator to cause an internal circuit of the semiconductor device to perform a predetermined process. The arbiter 33 determines whether to give priority to the first signal S4 or to the second processed signal S12 and provides a determination signal S13, which is based on the determination, to the main signal generator 34. For example, the arbiter 33 performs a logical operation with the first signal S4 and the second processed signal S12 to generate a determination signal S13.

The main signal generator 34 receives the first processed signal S11 and the determination signal S13, performs a logical operation with the two signals S11, S13, and generates a main signal S14 based on the logical operation result.

The variable filter unit 53 includes a set circuit 55 and at least one register 56. The variable filter unit 53 generates an adjusting signal S15, which delays the input signal IN, and provides the adjusting signal S15 to the filter 54.

The set circuit 55 sets data, which generates the adjusting signal S15, in the register 56. The set circuit 55 sets data in the register 56 based on a control signal received via the external terminal P2. The adjusting signal S15, which corresponds to the data set in the register 56, is provided to the filter 54.

The waveform of the second processed signal S12 is substantially the same as that of the first signal processed signal S11. Accordingly, the arbiter 33 obtains the same determination result as when using the first processed signal S11. However, the first processed signal S11 is delayed from the second processed signal S12 since the first signal processing unit 51 includes the filter 54. Accordingly, the arbiter 33 generates the determination signal S13 earlier than when using the first processed signal S11.

Thus, the main signal S14 is also generated earlier than when using the first processed signal S11 in the arbiter 33. As a result, the internal circuit of the semiconductor device operates earlier than when giving a determination based on the first processed signal S14.

The delay of the first processed signal S11 from the second processed signal S12 is determined by the filter value of the filter 54. In a system to which the semiconductor device is actually connected, filter adjusting data is provided to the variable filter unit 53 so that the filter value is adjusted in accordance with the noise components of the input signal IN. This operates the internal circuit of the semiconductor device in an optimal time that corresponds with the user's system.

The input circuit section (control circuit) 50 of the semiconductor device in the third embodiment has the advantages described below.

(1) The filter value of the filter 54 is adjustable. Thus, by adjusting the filter value in accordance with the noise of a user's system board, the time for an internal circuit to operate in response to the input signal IN is optimized.

(2) The input circuit section 50 includes a variable filter unit 53, which adjusts the filter value of the filter 54. Thus, a user may easily change the filter value in accordance with the system board.

Fourth Embodiment

Figure 19:
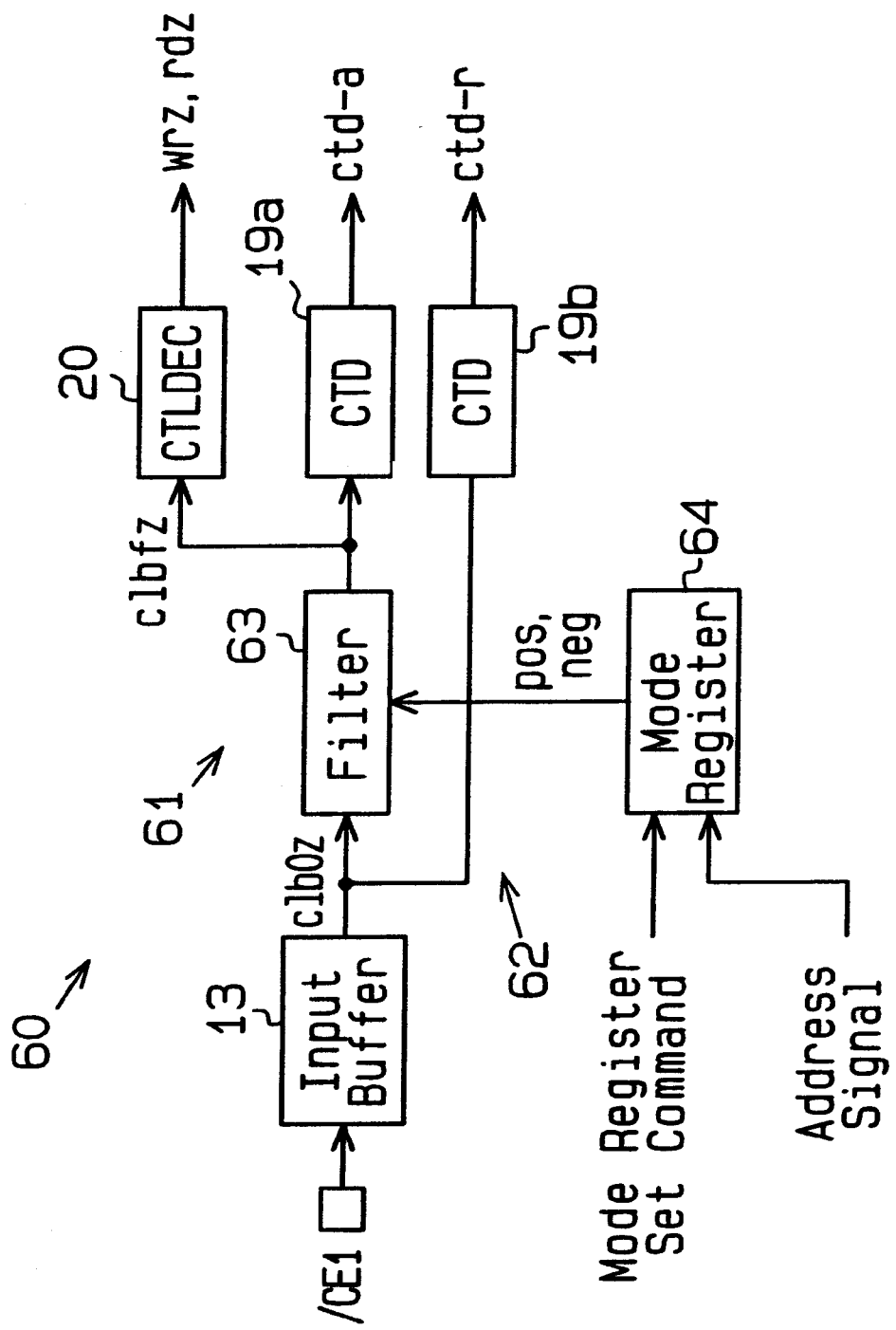
FIG. 19 is a schematic block circuit diagram of a semiconductor memory device according to a fourth embodiment of the present invention.

FIG. 19 is a block circuit diagram illustrating an input circuit section of a DRAM 60 provided with a function that automatically performs refreshing in a device. FIG. 19 shows an input circuit section for the chip enable signal /CE1 in a DRAM 60.

The input buffer 13 of the DRAM 60 receives the chip enable signal /CE1 and generates a buffer output signal clb0z based on the signal /CE1. The buffer output signal clb0z is provided to a first transition detection unit (first detection unit) 61 and a second transition detection unit (second detection unit) 62.

The first transition detection unit 61 includes a filter 63 and a transition detector 19a. The filter 63 receives adjusting signals pos, neg from a mode register (variable filter unit) 64 and changes the filter value based on the adjusting signals pos, neg.

The mode register 64 receives an external command from the control decoder 20 and the internal address signal a5z (FIG. 6), which is based on the external address signal Add. The control decoder 20 decodes a control signal, which is received from an external device, and generates a mode register set command. The mode register set command is provided to the mode register 64. The mode register 64 stores data, which is based on the internal address signal a5z, as filter value adjusting data in response to the mode register set command. The mode register 64 generates adjusting signals pos, neg based on the stored filter value adjusting data.

The filter 63 eliminates noise components of the buffer output signal clb0z with the filter value corresponding to the adjusting signals pos, neg and generates a noise-eliminate signal clbfz. The noise-eliminated signal clbfz is provided to the control decoder 20 and the transition detector 19a. The transition detector 19a detects the transition of the noise-eliminated signal clbfz and generates the detection signal ctd-a.

The second transition detection unit 62 includes a transition detector 19b. The transition detector 19b detects the transition of the buffer output signal clb0z and generates a detection signal ctd-r. The difference between the output timing of the detection signal ctd-r and the output timing of the detection signal ctd-a of the first transition detection unit 61 corresponds to the filter value of the filter 63.

In accordance with the state of the system board to which the DRAM 60 is connected, a mode register set command is issued during initial setting of the system board, and the filter adjusting data is stored in the mode register 64. The filter value of the filter 63 is adjusted in accordance with the data.

The DRAM 60 determines whether a command is an internal refresh request or an access request from an external device. The DRAM 60 shortens the time required for the external access when the internal refresh request and the external access request are overlapped. Further, by adjusting the filter value of the filter 63 in accordance with the system board, the internal circuit of the DRAM 60 is operated in a time that is optimal for the user's system.

Figure 20:
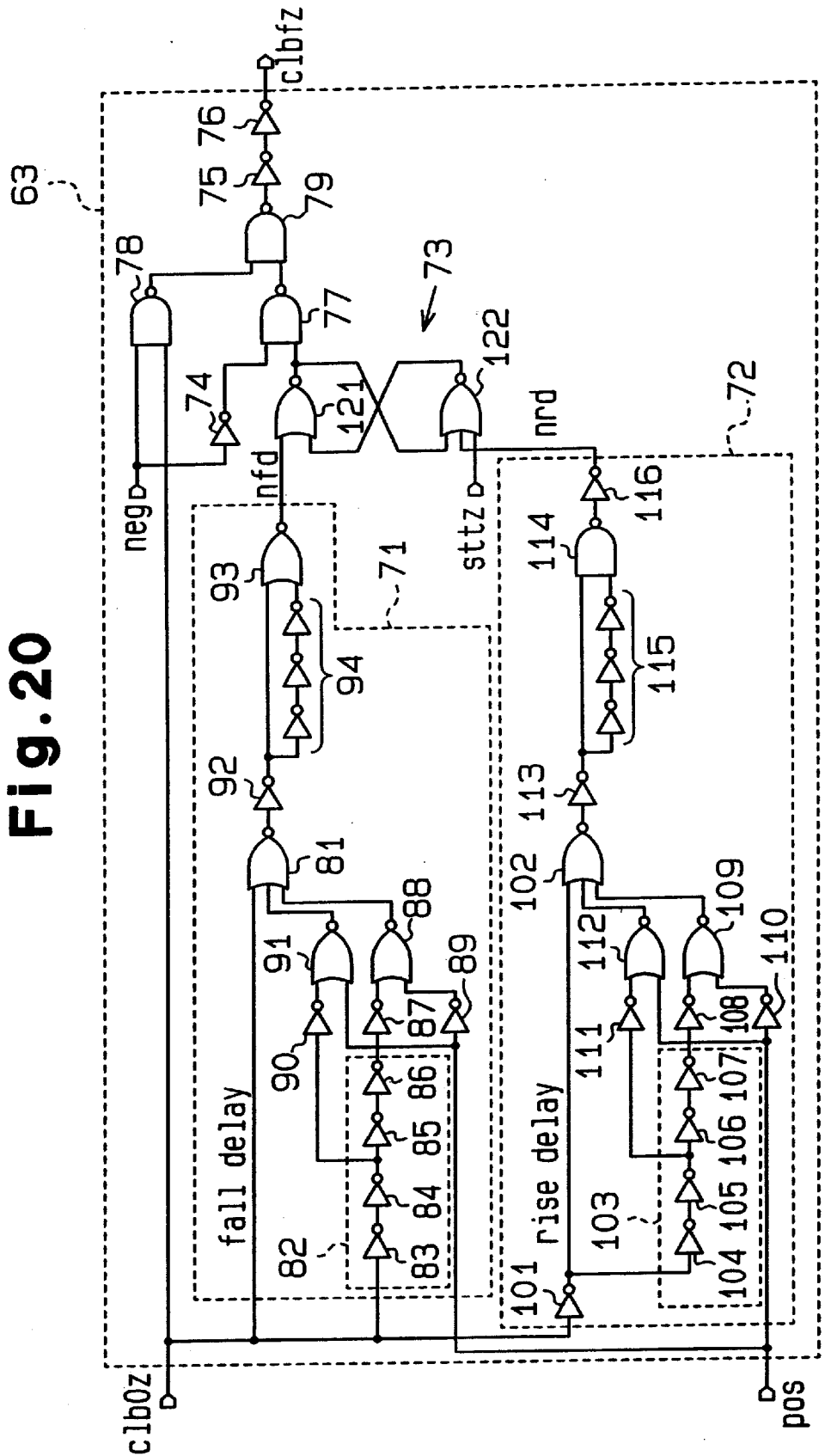
FIG. 20 is a schematic circuit diagram of a filter used in the device of FIG. 19.

FIG. 20 is a circuit diagram illustrating an example of the filter 63. The filter 63 includes first and second delay circuits 71, 72, a latch circuit 73, first to third inverters 74–76, and first to third NAND circuits 77–79.

The first and second delay circuits 71, 72 receive the input signal clb0z. The first delay circuit 71 delays the trailing edge of the input signal clb0z and generates a first delay signal nfd. The second delay circuit 72 delays the leading edge of the input signal clb0z and generates a second delay signal nrd.

The input signal clb0z is provided to a first NOR circuit 81 of the first delay circuit 71 and to a delay circuit 82. The delay circuit 82 includes an even number (in the fourth embodiment, four) of series-connected inverters 83–86.

The output signal of the delay circuit 82 is provided to an inverter 87, and the output signal of the inverter 87 is provided to a first input terminal of a second NOR circuit 88. A second input terminal of the second NOR circuit 88 is provided with the adjusting signal pos via an inverter circuit 89. Accordingly, the delay circuit 82 outputs the delayed input signal clb0z when the adjusting signal pos is high and generates an output signal at a low level when the adjusting signal pos is low. The output signal of the second NOR circuit 88 is provided to a second input terminal of the first NOR circuit 81.

The output signal of a certain inverter (in the fourth embodiment, the second inverter 84) in the delay circuit 82 is provided to an inverter 90. The output signal of the inverter 90 is provided to a first input terminal of a third NOR circuit 91. A second input terminal of the third NOR circuit 91 is provided with the adjusting signal pos. Accordingly, when the adjusting signal pos is low, the third NOR circuit 91 generates a signal by delaying the input signal clb0z with the two inverters 83, 84 of the delay circuit 82. When the adjusting signal pos is high, the third NOR circuit 91 generates a signal at a low level. The output signal of the third NOR circuit 91 is provided to a third input terminal of the first NOR circuit 81.

Accordingly, when the adjusting signal pos is low, the first NOR circuit 81 performs a logical operation with the input signal clb0z and the output signal of the third NOR circuit 91. When the adjusting signal pos is high, the first NOR circuit 81 performs a logical operation with the input signal clb0z and the output signal of the second NOR circuit 88. In other words, based on the level of the adjusting signal pos, the first NOR circuit 81 generates a signal by delaying the input signal clb0z by a predetermined time (first filter value) or generates a signal by delaying the input signal clb0z by a time corresponding to two inverters (second filter value) from the first filter value.

The output signal of the first NOR circuit 81 is directly provided to a first input terminal of a fourth NOR circuit 93 via an inverter 92. The output signal of the first NOR circuit 81 is also provided to a second input terminal of the fourth NOR circuit 93 via a delay circuit 94, which includes an odd number of series-connected inverters. The fourth NOR circuit 93 generates the first delay signal nfd based on the provided signal.

The input signal clb0z is provided to an inverter 101 of the second delay circuit 72. The input signal clb0z, which is inverted by the inverter 101, is provided to a first input terminal of a first NOR circuit 102 and a first input terminal of a delay circuit 103. The delay circuit 103 includes an even number (in the fourth embodiment, four) of inverters 104–107.

The output signal of the delay circuit 103 is provided to an inverter 108. The output signal of the inverter 108 is provided to a first input terminal of a second NOR circuit 109. The adjusting signal pos is provided to the second input terminal of the second NOR circuit 109 via an inverter 110. Accordingly, when the adjusting signal pos is high, the second NOR circuit 109 outputs the input signal clb0z, which is delayed by the delay circuit 103, and generates an output signal at a low level when the adjusting signal pos is low. the output signal of the second NOR circuit 109 is provided to a second input terminal of the first NOR circuit 102.

The output signal of a certain inverter (in the fourth embodiment, the second inverter 105) in the delay circuit 103 is provided to a first input terminal of a third NOR circuit 112 via an inverter 111. A second input terminal of the third NOR circuit 112 is provided with the adjusting signal pos. Accordingly, when the adjusting signal pos is low, the third NOR circuit 112 generates a signal by delaying the input signal clb0z with the two inverters 104, 105 of the delay circuit 103. When the adjusting signal pos is high, the third NOR circuit 112 generates a signal at a low level. The output signal of the third NOR circuit 112 is provided to a third input terminal of the first NOR circuit 102.

Accordingly, when the adjusting signal pos is high, the first NOR circuit 102 performs a logical operation with the input signal clb0z and the output signal of the second NOR circuit 109. When the adjusting signal pos is high, the first NOR circuit 102 performs a logical operation with the input signal clb0z and the output signal of the third NOR circuit 112. In other words, based on the level of the adjusting signal pos, the first NOR circuit 102 generates a signal by delaying the input signal clb0z by a predetermined time (first filter value) or generates a signal by delaying the input signal clb0z by a time corresponding to two inverter circuits (second filter value) from the first filter value.

The output signal of the first NOR 102 is directly provided to a first input terminal of a NAND circuit 114 via an inverter 113. The output signal of the first NOR circuit 102 is also provided to a second input terminal of the NAND circuit 114 via a delay circuit 115, which includes an odd number of series-connected inverters. The output signal of the NAND circuit 114 is provided to an inverter 116, and the inverter 116 generates the second delay signal nrd.

The first delay signal nfd and the second delay signal nrd are provided to the latch circuit 73. The latch circuit 73 includes first and second NOR circuits 121, 122. The first delay signal nfd is provided to a first input terminal of the first NOR circuit 121, and the second delay signal nrd is provided to a first input terminal of the second NOR circuit 122. The output signal of the second NOR circuit 122 is provided to a second input terminal of the first NOR circuit 121. The output signal of the first NOR circuit 121 is provided to a second input terminal of the second NOR circuit 122. A third input terminal of the second NOR circuit 122 is provided with a control signal sttz. The control signal sttz is a pulse signal generated by a detection circuit (not shown) when the DRAM is provided with power (activated).

The output signal of the first NOR circuit 121 is provided to a first input terminal of the first NAND circuit 77. The adjusting signal neg is provided to a second input terminal of the first NAND circuit 77 via the inverter 74. Further, the adjusting signal neg is provided to a first input terminal of the second NAND circuit 78. The input signal clb0z is provided to a second input terminal of the second NAND circuit 78. The output signal of the first and second NAND circuit 77, 78 are provided to the third NAND circuit 79. The output signal of the third NAND circuit 79 is provided to the inverter 76 via the inverter 75. The inverter 76 generates the signal clb0z based on the output signal of the third NAND circuit 79.

The first NAND circuit 77 generates a signal at a high level when the adjusting signal neg is high. When the adjusting signal neg is low, the first NAND circuit 77 latches the first and second delay signals nfd, nrd, inverts the latched first and second delay signals nfd, nrd, and outputs the inverted first and second delay signals nfd, nrd.

The second NAND circuit 78 generates a signal by inverting the input signal clb0z when the adjusting signal neg is high and generates a signal at a high level when the adjusting signal neg is low.

Accordingly, when the adjusting signal neg is high, the filter 63 generates the signal clbfz from the input signal clb0z through the second and third NAND circuits 78, 79 and the inverter circuits 75, 76. As shown in FIG. 21, when the adjusting signal neg is low, the filter 63 generates the signal clbfz, from which noise components have been eliminated through the delayed caused by the first or second filter value in accordance with the adjusting signal pos.

The DRAM (semiconductor memory device) 60 of the fourth embodiment has the advantage described below.

The mode register (variable filter unit) 64 of the DRAM 60 stores data for setting the filter value of the filter 63 in accordance with an external command. Thus, the filter value may be set with a simple sequence in accordance with the system board.

It should be apparent to those skilled in the art that the present invention may be embodied in many other specific forms without departing from the spirit or scope of the invention. Particularly, it should be understood that the present invention may be embodied in the following forms.

In the fourth embodiment, the data for setting the filter value of the registers 56, 64 may be set by commands, such as one used to enter a test mode. Further, the setting of the filter value may be set by trimming a fuse.

In the fourth embodiment, the filter value of the filter 63 may be adjusted through three or more steps. In this case, the mode register (variable filter unit) 64 generates a signal corresponding to the adjustable steps.

In the first and third embodiments, the main signal generator 34 may receive the second output signals S3, S12 from the second signal processing units 32, 52, and generate the main signals S6, S14 from the first output signals S2, S11 or the second output signals S3, S12 based on the determination signals S5, S13.

The present examples and embodiments are to be considered as illustrative and not restrictive, and the invention is not to be limited to the details given herein, but may be modified within the scope and equivalence of the appended claims.

What is claimed is:

1. A control circuit connected to an internal circuit of a semiconductor device, wherein the control circuit generates a main signal based on a first control signal and a second control signal to control the internal circuit, the control circuit comprising:
   a first signal processing unit for receiving the first control signal and generating a first processed signal from the first control signal, wherein the first signal processing unit includes a filter for filtering the first control signal;
   a second signal processing unit for receiving the first control signal and generating a second processed signal;
   an arbiter for receiving the second processed signal and the second control signal, determining which one of the second processed signal and the second control signal is to be given priority, and generating a determination signal based on the determination; and
   a main signal generator connected to the first signal processing circuit and the arbiter for generating the main signal from the determination signal or the first processed signal in accordance with the determination signal.

2. The control circuit according to claim 1, wherein the filter has a characteristic value varied in accordance with an adjusting signal.

3. The control circuit according to claim 1, wherein the arbiter determines whether to operate the internal circuit through internal control based on the second control signal or operate the internal circuit through external control in accordance with the first control signal.

4. The control circuit according to claim 3, wherein the filter has a characteristic value varied in accordance with an adjusting signal.

5. The control circuit according to claim 4, further comprising:
   a variable filter unit connected to the filter for generating the adjusting signal.

6. The control circuit according to claim 5, wherein the variable filter unit includes a register for storing data used to generate the adjusting signal, and a set circuit connected to the register to set the data in the register.

7. The control circuit according to claim 5, wherein the variable filter unit stores data for generating the adjusting signal in response to a control signal from an external device.

8. A semiconductor memory device for performing a self-refresh operation based on an internal refresh request signal, the device comprising:
   a first detection unit including a filter for receiving an external access request signal and eliminating a noise component from the external access request signal, wherein the first detection unit detects transition of an output signal of the filter and generates a first detection signal based on the detection;
   a second detection unit for receiving the external access request signal, detecting transition of the external access request signal, and generating a second detection signal based on the detection;
   an arbiter connected to the second detection unit for generating a determination signal based on the second detection signal and the internal refresh request signal, wherein the determination signal indicates which one of the external access request and the internal refresh request is to be given priority; and
   a main signal generator connected to the first detection unit and the arbiter for generating a main signal from the first detection signal or the determination signal in accordance with the determination signal to control the internal circuit of the device.

9. The device according to claim 8, wherein the filter has a characteristic value varied in accordance with an adjusting signal.

10. The device according to claim 9, further comprising:
    a variable filter unit connected to the filter for generating the adjusting signal.

11. The device according to claim 10, wherein the variable filter unit includes a register for storing data used to generate the adjusting signal, and a set circuit connected to the register to set the data in the register.

12. The device according to claim 10, wherein the variable filter unit stores data for generating the adjusting signal in response to a control signal from an external device.

13. A semiconductor memory device for performing a self-refresh operation based on an internal refresh request signal, the device comprising:
    a first detection unit including a first filter for receiving an external access request signal and eliminating a noise component from the external access request signal, wherein the first detection unit detects transition of an output signal of the first filter and generates a first detection signal based on the detection;
    a second detection unit for receiving the external access request signal, detecting transition of the external access request signal, and generating a second detection signal based on the detection;
    a first address transition detection unit including a second filter for receiving an external address signal and eliminating a noise component from the external address signal, wherein the first address transition detection unit detects transition of an output signal of the second filter and generates a first address detection signal based on the detection;
    a second address transition detection unit for receiving the external address signal, detecting transition of the external address signal, and generating a second address detection signal based on the detection;
    a first signal synthesizing circuit connected to the first detection unit and the first address transition detection unit for performing a logical operation with the first detection signal and the first address detection signal and generating a first synthesizing signal based on a result of the logical operation;
    a second signal synthesizing circuit connected to the second detection unit and the second address transition detection unit for performing a logical operation with the second detection signal and the second address detection signal and generating a second synthesizing signal based on a result of the logical operation;

an arbiter connected to the second signal synthesizing circuit for performing a logical operation with the second synthesizing signal and the internal refresh request signal and generating a determination signal based on a result of the logical operation, wherein the determination signal indicates which one of the external access request and the internal refresh request is to be given priority; and a main signal generator connected to the first signal synthesizing circuit and the arbiter for generating a main signal from the first detection signal or the determination signal in accordance with the determination signal to control the internal circuit of the device.

14. The device according to claim 13, wherein each of the first and second filters has a characteristic value varied in accordance with an adjusting signal.

15. The device according to claim 14, further comprising:
a variable filter unit connected to the first and second filters for generating the adjusting signal.

16. The device according to claim 15, wherein the variable filter unit includes a register for storing data used to generate the adjusting signal, and a set circuit connected to the register to set the data in the register.

17. The device according to claim 15, wherein the variable filter unit stores data for generating the adjusting signal in response to a control signal from an external device.

* * * * *